(12) United States Patent
Baker et al.

(10) Patent No.: US 6,956,517 B1
(45) Date of Patent: Oct. 18, 2005

(54) SYSTEMS AND METHODS FOR MULTI-CHANNEL ANALOG TO DIGITAL CONVERSION

(75) Inventors: E. Scott Baker, Allen, TX (US);
Gerald L. Fudge, Rockwall, TX (US);
Ross A. McClain, Jr., Greenville, TX (US)

(73) Assignee: L-3 Integrated Systems Company, Greenville, TX (US)

( * ) Notice: Subject to any disclaimer, the term of this patent is extended or adjusted under 35 U.S.C. 154(b) by 0 days.

(21) Appl. No.: 10/916,008

(22) Filed: Aug. 11, 2004

Related U.S. Application Data

(63) Continuation-in-part of application No. 10/866,532, filed on Jun. 12, 2004.

(60) Provisional application No. 60/585,173, filed on Jul. 2, 2004.

(51) Int. Cl.[7] .............................................. H03M 1/12
(52) U.S. Cl. ...................... 341/155; 341/120; 341/118
(58) Field of Search ........................ 341/118, 119, 120, 341/117, 161, 143, 155; 342/162; 708/3

(56) References Cited

U.S. PATENT DOCUMENTS

| | | | |
|---|---|---|---|
| 3,894,219 A * | 7/1975 | Weigel | 708/3 |
| 4,531,098 A | 7/1985 | Reed | |
| 4,542,265 A | 9/1985 | Brady | |
| 5,061,934 A * | 10/1991 | Brown et al. | 342/162 |
| 5,221,926 A * | 6/1993 | Jackson | 341/118 |
| 6,198,819 B1 | 3/2001 | Farrell et al. | |
| 6,373,418 B1 * | 4/2002 | Abbey | 341/143 |
| 6,516,063 B1 | 2/2003 | Farrell et al. | |
| 6,661,362 B2 * | 12/2003 | Brooks | 341/143 |
| 6,734,818 B2 * | 5/2004 | Galton | 341/161 |
| 6,741,701 B1 | 5/2004 | Barak et al. | |
| 6,784,814 B1 * | 8/2004 | Nair et al. | 341/118 |

FOREIGN PATENT DOCUMENTS

| GB | 2296398 A | 6/1996 |
|---|---|---|
| GB | 2296398 A * | 6/1996 |

OTHER PUBLICATIONS

Dr. Martinez, "Intelligent Mixed-Signal Microsystems Technology (IMMST)", DARPA/MTO, Apr. 25, 2003, 8 pgs.

Matsuya et al., "A 16-Bit Oversampling A-to-D Conversion Technology Using Triple-Integration Noise Shaping", IEEE Journal Of Solid-State Circuits, vol. SC-22, No. 6, Dec. 1987, pps. 921-929.

Wu et al., "New Current-Mode Wave-Pipelined Architectures For High-Speed Analog-To-Digital Converters", IEEE Transactions On Circuits And Systems-I: Regular Papers, vol. 51, No. 1, Jan. 2004, pps. 25-37.

Liem et al., "Architecture Of A Single Chip Acoustic Echo And Noise Canceller Using Cross Spectral Estimation", IEEE, 2003, pps. 637-640, vol. 2., Apr. 2-6, 2003.

Younis et al, "Efficient Adaptive Receivers For Joint Equalization And Interference Cancellation In Multiuser Space-Time Block-Coded Systems", IEEE Transactions on Signal Processing, vol. 51, No. 11, Nov. 2003, pps. 2849-2862.

(Continued)

*Primary Examiner*—Jean Bruner Jeanglaude
(74) *Attorney, Agent, or Firm*—O'Keefe, Egan & Peterman, LLP

(57) ABSTRACT

Systems and methods for analog to digital conversion that may be implemented using a digital to analog converter (DAC) to provide negative feedback to cancel signals at the input of an analog to digital converter (ADC), and that may be used to extend the effective dynamic range of an ADC. The systems and methods may be implemented in multi-channel environments.

36 Claims, 9 Drawing Sheets

OTHER PUBLICATIONS

Fudge et al, "Spatial Blocking Filter Derivative Constraints For The Generalized Sidelobe Canceller And Music", IEEE Transactions On Signal Processing, vol. 44, No. 1, Jan. 1996, pps. 51-61.

Lin et al., "A Low-Complexity Adaptive Echo Canceller For XDSL Applications", IEEE Transactions On Signal Processing, vol. 52, No. 5, May 2004, pps. 1461-1465.

Inerfield et al., High Dynamic Range InP HBT Delta-Sigma Analog-to-Digital Converters, IEEE Journal Of Solid-State Circuits, vol. 38, No. 9, Sep. 2003, pps. 1524-1532.

Harris et al., "New Architectures With Distributed Zeros For Improved Noise Shaping Of Delta-Sigma Analog To Digital Converters", IEEE, 1993, pps. 421-425, Nov. 1-3, 1993, vol. 1.

Ueno et al., "A Fourth-Order Bandpass Δ-Σ Modulator Using Second-Order Bandpass Noise-Shaping Dynamic Element Matching", IEEE Journal Of Solid-State Circuits, vol. 37, No. 7, Jul. 2002, pps. 809-816.

Vadipour, "A Bandpass Mismatch Noise-Shaping Technique For Σ-Δ Modulators", IEEE Transactions On Circuits And Systems-II: Express Briefs, vol. 51, No. 3, Mar. 2004, pps. 130-135.

Lefkaditis et al., "Ambiguities In The Harmonic Retrieval Problem Using Non-Uniform Sampling", IEEE Proc.-Radar, Sonar Navig., vol. 148, No. 6, Dec. 2001, pps. 325-329.

Sayiner et al., "A Non-Uniform Sampling Technique for A/D Conversion", Circuits and Systems, ISCAS '93, 1993 IEEE International Symposium, May 3-6, 1993, pps. 1220-1223 vol. 2.

U.S. Appl. No. 10/866,532, filed Jun. 12, 2004, "Systems And Methods For Analog To Digital Conversion" (LCOM: 024).

Sumanen et al., "Dual-Mode Pipeline A/D Converter For Direct Conversion Receivers", Electronics Letters, vol. 38, No. 19, Sep. 2002, pps. 1101-1103.

Stojcevski et al., "A Reconfigurable Analog-To-Digital Converter For Utra-Tdd Mobile Terminal Receiver", IEEE, 2002, pps. 613-616, vol. 2, Aug. 4-7, 2002.

Petraglia et al., "Analysis Of Mismatch Effects Among A/D Converters In A Time-Interleaved Waveform Digitizer", IEEE Transactions On Instrumentation And Measurement, vol. 40, No. 5, Oct. 1991, pps. 831-835.

Peralias et al., "Structural Testing Of Pipelined Analog To Digital Converters", IEEE, 2001, pps. 436-439, vol. 1, May 6-9, 2001.

Ndjountche et al., "Adaptive Calibration Techniques For Time-Interleaved ADCs", Electronics Letters, vol. 37, No. 7, Mar. 2001, pps. 412-414.

Mortezapour et al, "A Reconfigurable Pipelined Data Converter", IEEE, 2001, pps. 314-317, vol. 4, May 6-9, 2002.

Lundin et al., "On External Calibration Of Analog-To Digital Converters", IEEE, 2001, pps. 377-380, Aug. 6-8, 2001.

Liu et al., "A 9-b 40-Msample/s Reconfigurable Pipeline Analog-To-Digital Converter", IEEE Transactions On Circuits And Systems-II: Analog And Digital Signal Processing, vol. 49, No. 7, Jul. 2002, pps.449-456.

Ganesan et al., "Analog-Digital Partitioning For Field-Programmable Mixed Signal Systems", IEEE, 2001, pps. 172-185, Mar. 14-16, 2001.

Asuri et al., "Time-Stretched ADC Arrays", IEEE Transactions On Circuits And Systems-II: Analog And Digital Signal Processing, vol. 49, No. 7, Jul. 2002, pps. 521-524.

Younis et al., "A Calibration Algorithm For A 16-Bit Multi-Path Pipeline ADC", IEEE Midwest Symp. On Circuits And Systems, 43rd, Aug. 2000, pps. 158-161.

Wang et al., "Tunable Optical Wavelength Converter With Reconfigurable Functionality", Technical Digest, 1997, pps. 76-77, Feb. 16-21, 1997.

Veljanovski et al., "Reconfigurable Architecture For Utra-TDD System", Electronics Letters, vol. 38, No. 25, Dec. 2002, pps. 1732-1733.

Velazquez, "High-Performance Advanced Filter Bank Analog-To-Digital Converter For Universal RF Receivers", IEEE, 1998, pps. 229-232, Oct. 6-9, 1998.

Poorfard et al., "Time-Interleaved Oversampling A/D Converters: Theory And Practice", IEEE Transactions On Circuits And Systems-II:Analog And Digital Signal Processing, vol. 44, No. 8, Aug. 1997, pps. 634-645.

Jamal et al., "A 10-b 120-Msample/s Time-Interleaved Analog-To-Digital Converter With Digital Background Calibration", IEEE Journal Of Solid-State Circuits, vol. 37, No. 12, Dec. 2002, pps. 1618-1627.

Gulati et al., "A Low-Power Reconfigurable Analog-To-Digital Converter", IEEE Journal Of Solid-State Circuits, vol. 36, No. 12, Dec. 2001, pps. 1900-1911.

Lee, "Reconfigurable Analog Integrated Circuit Architecture Based On Switched-Capacitor Techniques", IEEE, 1996, pps. 148-158, Oct. 9-11, 1996.

Yu et al., "Error Analysis For Time-Interleaved Analog Channels", IEEE, 2001, pps. 468-471, vol. 1, May 6-9, 2001.

Bernardinis et al, "Dynamic Stage Matching For Parallel Pipeline A/D Converters", IEEE, 2002, pps. 905-908, vol. 1, May 26-29, 2002.

Batten et al., "Calibration Of Parallel ΔΣ ADCs", IEEE Transactions On Circuits And Systems-II: Analog And Digital Signal Processing, vol. 49, No. 6, Jun. 2002, pps. 390-399.

Mayes et al, "A Low-Power 1MHz, 25 mW 12-Bit Time-Interleaved Analog-To-Digital Converter", IEEE Journal On Solid-State Circuits, vol. 31, No. 2, Feb. 1996, pps. 169-178.

Lee, "Reconfigurable Data Converter As A Building Block For Mixed-Signal Test", IEEE, 1997, pps. 359-363, Mar. 17-20, 1997.

Lee, "Reconfigurable Pipelined Data Converter Architecture", IEEE, pps. 162-165, vol. 1, Aug. 18-21, 1996.

Jin et al., "A Digital Technique For Reducing Clock Jitter Effects In Time-Interleaved A/D Converter", IEEE, 1999, pps. 330-333, vol. 2, May 30-Jun. 2, 1999.

Gulati et al., "A Low-Power Reconfigurable Analog-To-Digital Converter", IEEE International Solid-State Circuits Conference, 2001, 3 pgs, Feb. 5-7, 2001.

Dyer et al., "An Analog Background Calibration Technique For Time-Interleaved Analog-To-Digital Converters", IEEE Journal Of Solid-State Circuits, vol. 33, No. 12, Dec. 1998, pps. 1912-1919.

* cited by examiner

SYSTEMS AND METHODS FOR MULTI-CHANNEL ANALOG TO DIGITAL CONVERSION

The present application is a continuation-in-part of co-pending U.S. patent application Ser. No. 10/866,532 filed Jun. 12, 2004 is still pending, the disclosure of which is incorporated herein by reference in its entirety. The present application also claims priority to co-pending United States provisional patent application Ser. No. 60/585,173 filed Jul. 2, 2004, the disclosure of which is also incorporated herein by reference in its entirety.

BACKGROUND OF THE INVENTION

1. Field of the Invention

This invention relates generally to signal processing, and more particularly to conversion of analog signals to digital signals.

2. Description of the Related Art

Conversion of analog signals to digital signals is employed for many signal processing applications. Examples of such applications include communications, sonar, radar, signals intelligence high quality headsets, hearing devices, etc. In some applications, a strong interfering signal may be present along with a weak desired analog signal that is to be processed by an analog to digital converter (ADC or A2D). Under such conditions, the ADC may not have enough dynamic range to handle the strong interferer and weak signal simultaneously. In this case, the ADC may become saturated by the strong interfering signal and the weak desired signal may be at best distorted and hard to detect and measure, and at worst may be rendered completely non-recoverable. Under some signal conditions, such as signals intelligence applications, there may be multiple strong signals such as jammers or interferers, and one or more desired signals. There may also be cases in which there is a single strong signal, but it is broadband in nature. In some cases, the desired signal/s may be relatively weak in comparison to the strong interferer/s.

Analog to digital converters are limited by their dynamic range which is measure of the strongest signal power to the weakest signal power allowed in which both signals can be detected. In the past, more bits have been added to an ADC in an attempt to increase dynamic range and facilitate analog to digital conversion of weaker desired signals in environments where strong interfering signals are present. However, increasing the number of bits results in limited bandwidth or higher power consumption, large form factor, heat dissipation, and cost. Furthermore, the current state of the art limits the amount of dynamic range that can be achieved by adding bits to an ADC. Another past approach for addressing strong interference and to increase the effective dynamic range has been to add upstream programmable analog filtering, together with interference detection and estimation, and controls for the programmable analog filtering. However, the interference suppression capability of this approach is limited by the shape control of analog filters, and it is not possible with this approach to remove an interferer that is occupying the same spectral space as the weak signal. It has also been proposed to address strong interference with weak analog signals by using a noise-shaping delta sigma ADC to suppress the interference while passing the desired weaker signal. While presenting an integrated approach with better form factor, this proposal suffers from similar drawbacks as upstream analog filtering. Further, filter performance and flexibility provided by currently available noise-shaping ADCs is not as good as the filter performance and flexibility provided by available separate analog filters.

Another proposed technique to effectively increase the dynamic range of an ADC is to use non-uniform sampling at an average rate less than Nyquist sampling. The advantage of non-uniform sampling is that the ADC average speed is slower and hence the ADC can be designed with more bits while keeping the total cost and power consumption reasonable and allowing more effective bits to be achieved. This approach suffers from lost information caused by the non-uniform sub-Nyquist sampling (limiting the signal environment that the technique will work) and costly post-processing requirements, along with difficulty in achieving the timing accuracy required for signal re-construction even in the limited environments that the technique can work.

Another technique used to increase the dynamic range of ADCs is to time-interleave multiple ADCs. This allows slower ADCs with more bits to be used, while increasing the total sample rate by using multiple ADCs. This technique suffers from increased power consumption, heat dissipation, and costly post-processing to correct interleaving imperfections and to compensate for differing channel characteristics. In addition, this technique is limited as to how many ADCs effectively be interleaved in practice, even with post-processing correction.

Yet another proposal has been made to combine the outputs of two ADCs that process an input signal that includes a weak desired signal in the presence of a strong interferer. In this latter proposal, a first one of the two ADCs is provided with an attenuator that provides an attenuated input to the first ADC, and the second one of the two ADCs has a non-attenuated input. The second non-attenuated ADC becomes saturated in the presence of the strong interferer while the first attenuated ADC remains unsaturated. However, once the second non-attenuated ADC becomes saturated, there is not a way to intelligently combine the output information from the saturated second ADC with the output information from the non-saturated first ADC; thus this approach requires two separate receiver paths and the associated processing and is therefore inefficient.

SUMMARY OF THE INVENTION

Disclosed herein are systems and methods for analog to digital conversion that may be implemented by providing analog feedback to at least partially cancel one or more signals (e.g., one or more interfering signals present with one or more desired signals, one or more strong desired signals, etc.) at the analog input of an ADC, and that may be used in one embodiment to extend the effective dynamic range of an ADC. In this regard, the effective dynamic range of an ADC may be extended by detecting and isolating signals and using digital adaptive digital filtering along with a digital to analog converter (DAC) to provide negative feedback to cancel the signal/s at the input of the ADC. Among other things, the disclosed systems and methods may be advantageously implemented in one exemplary embodiment to provide a more power-efficient and cost effective method of handling a weak desired signal in the presence of a strong interferer than adding more bits to an ADC, and may be further implemented to provide more adaptability than using analog or digital notch filtering.

In one embodiment of the disclosed systems and methods, an ADC interference cancellation system may be implemented using one or more ADC devices coupled to at least one DAC device in a manner so as to provide increased dynamic range for analog to digital conversion of one or more desired signals that are present in an analog input signal to the system that also contains one or more interfering signals. In such an embodiment, the ADC interference cancellation system may be configured (e.g., as a combined hardware/software analog feedback loop) so that the DAC provides negative feedback in the form of at least one analog cancellation signal that is combined with the system input signal so that the analog cancellation signal acts to at least partially cancel one or more of the interfering signal/s that is present in the input signal. Advantageously, such an interference cancellation system may be implemented under conditions in which the desired signal/s are relatively weak in comparison to the interfering signal/s, e.g., where one or more interfering signals without modification are sufficiently strong to saturate a signal ADC component of the system.

In one exemplary embodiment, an ADC interference cancellation system may be implemented to include at least one signal ADC device configured for analog to digital conversion of a desired signal and any co-existing interfering signal/s present in an analog input signal to the system. Digital feedback circuitry may be provided that is configured to provide a digital feedback signal to a signal cancellation DAC that results in the generation of at least one analog cancellation signal that is combined with the analog input signal to the system in a manner that at least partially cancels one or more interfering signals that are present in the system input signal. The digital feedback circuitry may include, for example, at least one additional ADC device that is configured as a cancellation ADC component for analog to digital conversion of the interfering signal/s, at least one digital adaptive digital filter for filtering the digital feedback signal, or a combination thereof. The digital feedback circuitry may further be configured to implement one or more control components, such as digital adaptation or interference-cancellation algorithms, for controlling one or more signal cancellation components within the digital feedback circuitry such as a cancellation ADC, adaptive digital filter, or combination thereof.

Advantageously, an ADC system may be configured in one exemplary embodiment so that one or more of the ADC devices within the system operate in a non-saturated or partially-saturated condition under anticipated system input signal conditions. For example, an ADC system may include a cancellation ADC device that is configured to operate in a non-saturated or partially saturated condition under all anticipated analog input signal system conditions, whether or not the signal ADC device of the same system also operates in a saturated or non-saturated condition. Alternatively, an ADC system may be configured in another embodiment to include at least one cancellation ADC device and at least one signal ADC device that are each configured to operate in non-saturated condition under all anticipated system input signal conditions. In yet another embodiment, an ADC system may be configured so that all of the ADC devices included within the system operate in a non-saturated condition under all anticipated system input signal conditions.

When implemented in an interference cancellation embodiment, the disclosed systems and methods may be advantageously implemented to at least partially cancel one or more interferer signals of varying strength that may be present in an analog input signal with one or more desired signals in the signal path of a signal ADC device. In this regard, one or more interferers present in the analog input signal may have an unmodified strength that is sufficient to fully or partially saturate the signal ADC, one or more interferers present in the analog input signal may have an unmodified strength that is not sufficient to even partially saturate the signal ADC, or a combination of such types of interferer signals may be present.

In other embodiments, the disclosed systems and methods may be implemented to provide an increased dynamic range of analog to digital conversion by increasing or broadening the range of signal strengths that may be present in an analog input signal while at the same time allowing successful detection and analog to digital conversion of one or more of the individual signals within the analog input signal. Thus, the disclosed systems and methods may be implemented to extend the dynamic range between the maximum signal power of a relatively strong signal (e.g., relatively strong interferer) and the minimum signal power of a relatively weak signal (e.g., relatively weak desired signal) detectable in a given analog input signal. For example, in one exemplary embodiment, the disclosed systems and methods may be implemented to allow detection of a relatively weak first desired signal in the presence of a relatively strong second signal that has a strength of 100 dB or more above the strength of the relatively weak desired signal.

In one exemplary embodiment, the disclosed systems and methods may be implemented to increase the dynamic range capability of a given ADC device (e.g., commercial off the shelf (COTS) ADC device), so that it is capable of detecting a relatively weak desired signal in the presence of a relatively strong interferer having a strength of 100 dB or more above the strength of the weak desired signal. For example, in one hypothetical implementation, a COTS 8-bit ADC with 7.75 effective number of bits (e.g., such as a Max-108 available from Maxim Integrated Products, Inc. of Sunnyvale, Calif.) may be integrated with an ADC interference cancellation system (e.g., such as the system configuration of FIG. 3) of the disclosed systems and methods so that it is capable of detecting a relatively weak desired signal in the presence of a relatively strong interferer having a strength of 100 dB or more above the weak desired signal.

In other embodiments, disclosed herein are systems and methods for analog to digital conversion that involve interference cancellation of multiple jammers or jammers with non-zero bandwidth. To reduce the impact of the jammer/interferer signals, a multi-channel interference canceller may be implemented in conjunction with an A/D converter. Multi-channel embodiments of the disclosed systems and methods may be implemented in spatial and temporal configurations. In one exemplary embodiment, the disclosed multi-channel systems and methods may be advantageously implemented to provide sufficiently high dynamic range for analog to digital conversion so as to allow processing of relatively weak desired signals in the presence of relatively strong interferer signals. The disclosed multi-channel systems and methods may be employed for the conversion of analog signals to digital signals (e.g., radio frequency signals, acoustic signals, etc.) in a variety of signal processing applications, e.g., digital receivers, communications systems, sonar, radar, high quality headsets, hearing devices, etc.

In one respect, disclosed herein is an analog to digital conversion system having an analog input and a digital output. The system may include: a signal analog to digital conversion (ADC) component having an analog signal input coupled to the analog input of the system and a digital signal output coupled to the digital output of the system; a signal cancellation digital to analog conversion (DAC) component having a digital signal input and an analog signal output, the analog signal output being coupled between the input of the analog to digital conversion system and the analog input of the signal ADC component; and digital feedback circuitry having a digital signal input coupled to the digital signal output of the signal ADC component, and having a digital signal output coupled to the cancellation DAC component. The analog input of the system may be configured to receive a system analog input signal that may be of sufficient strength to at least partially saturate the signal ADC component, and the signal cancellation DAC may be configured to provide an analog cancellation signal for combination with the system analog input signal to produce a modified analog input signal that does not saturate the signal ADC component.

In another respect, disclosed herein is an analog to digital conversion system having a system analog input for receiving a system analog input signal and a system digital output for providing a system digital output signal. The system may include: a signal analog to digital conversion (ADC) component having an analog signal input coupled to the system analog input and a digital signal output coupled to the system digital output; a signal cancellation digital to analog conversion (DAC) component having a digital signal input and an analog signal output, the analog signal output being coupled between the system analog input and the analog input of the signal ADC component; and digital feedback circuitry including a cancellation ADC component coupled to the system analog input, the digital feedback circuitry having a digital signal input coupled to the digital signal output of the signal ADC component, and a digital signal output coupled to the cancellation DAC component.

In another respect, disclosed herein is a method for analog to digital conversion of a signal, including: combining an analog input signal with an analog cancellation signal to form a modified analog input signal; converting the modified analog input signal to a digital output signal in a first analog to digital conversion (ADC) component; producing a digital feedback signal based at least in part on the digital output signal; and converting the digital feedback signal to the analog cancellation signal. The method may be implemented under conditions where the analog input signal has a signal strength sufficient to at least partially saturate the first ADC component, and the modified analog input signal has a signal strength that is not sufficient to saturate the first ADC component.

In another respect, disclosed herein is a method for analog to digital conversion of a signal, including: combining an analog input signal with an analog cancellation signal to form a modified analog input signal; converting the modified analog input signal to a digital output signal; producing a digital feedback signal based at least in part on the digital output signal and on at least one analog signal that may be based at least in part on the analog input signal; and converting the digital feedback signal to the analog cancellation signal.

In another respect, disclosed herein is an analog to digital conversion system having an analog input and a digital output. The system may include: a signal analog to digital conversion (ADC) component having an analog signal input coupled to the analog input of the system and a digital signal output coupled to the digital output of the system; a signal cancellation digital to analog conversion (DAC) component having a digital signal input and an analog signal output, the analog signal output being coupled between the input of the analog to digital conversion system and the analog input of the signal ADC component; a first digital feedback circuitry signal path having a digital signal input coupled to the digital signal output of the signal ADC component, and having a digital signal output; and at least one additional digital feedback circuitry signal path having a digital signal input coupled to the digital signal output of the signal ADC component, and having a digital signal output provided for combination with the digital signal output of the first digital feedback circuitry signal path to produce a combined digital output signal. In this embodiment, the signal cancellation DAC may be configured to receive the combined digital output signal and to provide an analog cancellation signal based on the combined digital output signal for combination with the system analog input signal to produce a modified analog input signal.

In another respect, disclosed herein is an analog to digital conversion system having a system analog input for receiving a system analog input signal and a system digital output for providing a system digital output signal. The system may include: a signal analog to digital conversion (ADC) component having an analog signal input coupled to the system analog input and a digital signal output coupled to the system digital output; a signal cancellation digital to analog conversion (DAC) component having a digital signal input and an analog signal output, the analog signal output being coupled between the system analog input and the analog input of the signal ADC component; a first digital feedback circuitry signal path including a first cancellation ADC component coupled to the system analog input, the first digital feedback circuitry signal path having a digital signal input coupled to the digital signal output of the signal ADC component, and the first digital feedback circuitry signal path further having a digital signal output; and at least one additional digital feedback circuitry signal path including a cancellation ADC component coupled to the system analog input. In this embodiment, the at least one additional digital feedback circuitry signal path may have a digital signal input coupled to the digital signal output of the signal ADC component. The at least one additional digital feedback circuitry signal path may further have a digital signal output provided for combination with the digital signal output of the first digital feedback circuitry signal path to produce a combined digital output signal. The signal cancellation DAC may be configured to receive the combined digital output signal and to provide an analog cancellation signal based on the combined digital output signal for combination with the system analog input signal to produce a modified analog input signal.

In another respect, disclosed herein is a method for analog to digital conversion of a signal, including: combining an analog input signal with an analog cancellation signal to form a modified analog input signal; converting the modified analog input signal to a digital output signal in a first analog to digital conversion (ADC) component; producing a first digital feedback signal based at least in part on the digital output signal; producing at least one additional digital feedback signal based at least in part on the digital output signal; combining the first digital feedback signal with the at least one additional digital feedback signal to produce a combined digital feedback signal; and converting the combined digital feedback signal to the analog cancellation signal.

In another respect, disclosed herein is a method for analog to digital conversion of a signal, including: combining an analog input signal with an analog cancellation signal to form a modified analog input signal; converting the modified analog input signal to a digital output signal; producing at least two digital feedback signals, each of the at least two digital feedback signals being based at least in part on the digital output signal and on at least one analog signal;

combining the at least two digital feedback signals to produce a combined digital feedback signal; and converting the combined digital feedback signal to the analog cancellation signal.

In another respect, disclosed herein is an analog to digital conversion system having a system analog input for receiving a system analog input signal and a system digital output for providing a system digital output signal, the system including: a signal analog to digital conversion (ADC) component having a first analog signal input coupled to the system analog input and a digital signal output coupled to the system digital output; a signal cancellation digital to analog conversion (DAC) component having a digital signal input and an analog signal output, the analog signal output being coupled between the system analog input and the analog input of the signal ADC component; and a first digital feedback circuitry signal path including a cancellation ADC component coupled to a second analog signal input, the first digital feedback circuitry signal path having a digital signal input coupled to the digital signal output of the signal ADC component, and the first digital feedback circuitry signal path further having a digital signal output. In this embodiment, the signal cancellation DAC may be configured to receive the digital signal output of the first digital feedback circuitry signal path and to provide an analog cancellation signal based on the digital signal output of the first digital feedback circuitry signal path for combination with the system analog input signal to produce a modified analog input signal.

In another respect, disclosed herein is a method for analog to digital conversion of a signal, including: combining a first analog input signal with an analog cancellation signal to form a modified analog input signal; converting the modified analog input signal to a digital output signal; producing a first digital feedback signal based at least in part on the digital output signal and on at least one analog signal that is based at least in part on a second analog input signal; and converting the first digital feedback signal to the analog cancellation signal.

In another respect, disclosed herein is a method for analog to digital conversion of a signal, including: combining a first analog input signal with an analog cancellation signal to form a modified analog input signal; converting the modified analog input signal to a digital output signal; producing a first digital feedback signal based at least in part on the digital output signal and on at least one analog signal that is based at least in part on a second analog input signal; producing a second digital feedback signal based at least in part on the digital output signal and on at least one analog signal that is based at least in part on a third analog input signal; combining the first and second digital feedback signals to produce a combined digital feedback signal; and converting the combined digital feedback signal to the analog cancellation signal.

DESCRIPTION OF ILLUSTRATIVE EMBODIMENTS

Figure 1:
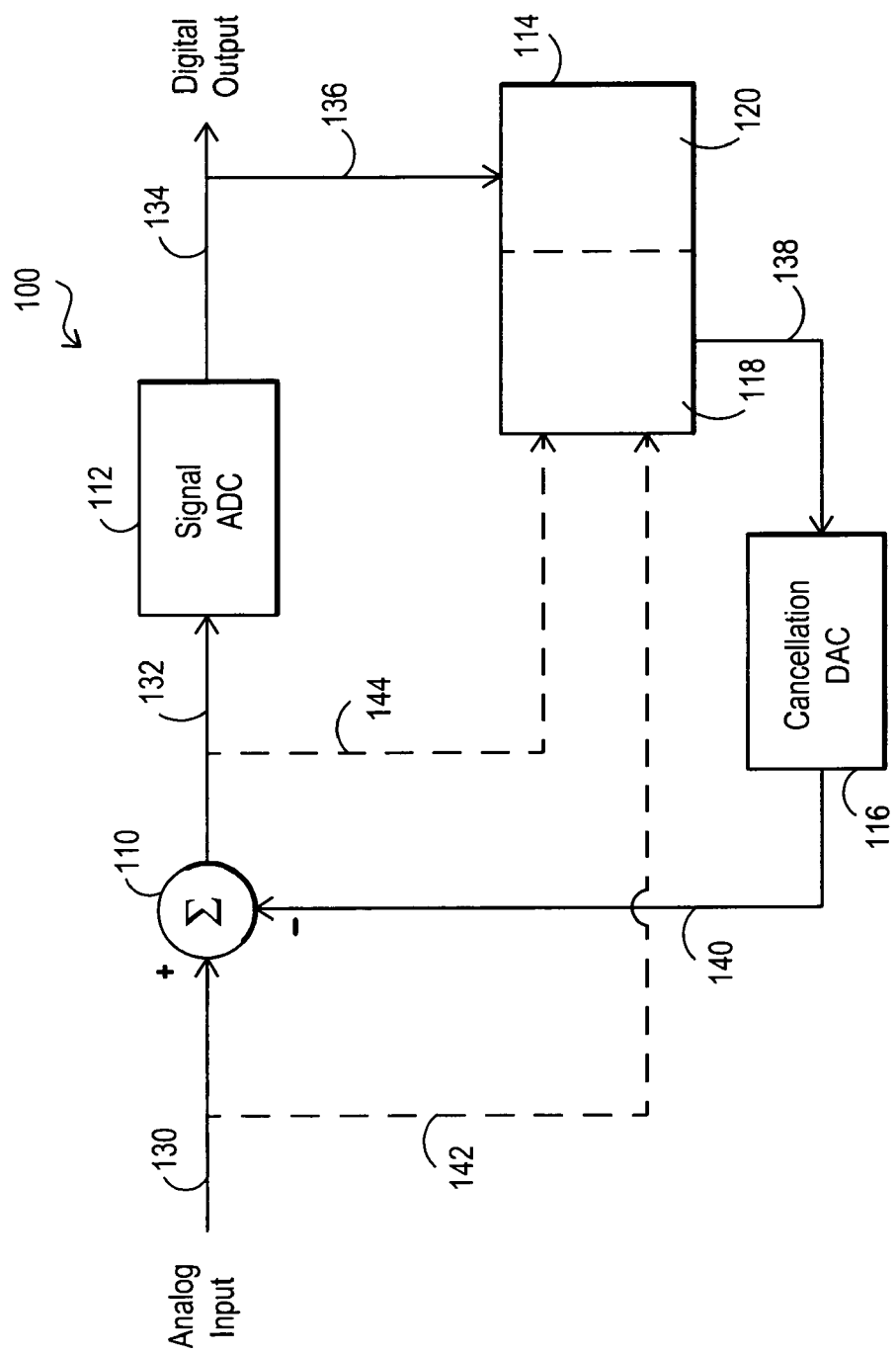
FIG. 1 illustrates an ADC system according to one embodiment of the disclosed systems and methods.

FIG. 1 illustrates an analog to digital conversion system 100 as it may be configured according to one embodiment of the disclosed systems and methods. As shown in FIG. 1, system 100 is configured to receive an analog input signal 130 and to provide a digital output signal 134. Analog input signal 130 may include one or more signals that without further modification would saturate signal ADC component 112. For example, analog input signal 130 may include one or more weak desired signals in the presence of one or more strong interferer signals that without further modification would saturate signal ADC component 112. Alternatively, analog input signal 130 may include one or more strong desired signals (with or without the presence of one or more interferer signals) that without further modification would saturate signal ADC component 112. ADC system 100 may be employed for the conversion of analog signals to digital signals (e.g., radio frequency signals, acoustic signals, etc.) in a variety of signal processing applications, e.g., digital receivers, communications systems, sonar, radar, high quality headsets, hearing devices, etc. In one embodiment, the dynamic range capability for analog to digital conversion of signals in such applications may be advantageously increased using the disclosed systems and methods.

Illustrated components of system 100 include cancellation DAC component 116 that is configured to provide an analog cancellation signal 140 for combination with analog input signal 130 at summer 110 in any manner that is suitable for producing a modified analog input signal 132 that does not saturate signal ADC component 112. In this regard, analog cancellation signal 140 may include an analog signal that is an in-phase representation of at least one signal (e.g., interferer signal, desired signal, etc.) within analog input signal 130 that is subtracted from analog input signal 130 at summer 110, or analog cancellation signal 140 may alternatively include an analog signal that is provided from digital feedback circuitry 114 and signal cancellation DAC 116 as an out of phase representation of such a signal within analog input signal 130 and that is added to analog input signal 130 at summer 110. In either case, analog cancellation signal 140 may be combined with analog input signal 130 at summer 110 in a manner that acts to at least partially cancel at least one signal in analog input signal 130, e.g., so that the resulting modified analog input signal 132 does not saturate signal ADC component 112.

Still referring to FIG. 1, system 100 includes digital feedback circuitry 114 that is provided for receiving digital output signal 136 from signal ADC and for providing digital feedback signal 138 to signal cancellation DAC component 116 to cause production of analog cancellation signal 140. Digital feedback circuitry 114 may be any circuitry component/s suitable for producing a digital feedback signal 138 based at least in part on digital output signal 136 that causes signal cancellation DAC component 116 to produce an analog cancellation signal 140 to at least partially cancel one or more signals (e.g., interferers and/or desired signals) present in analog input signal 130. For example, digital feedback circuitry 114 may be configured to monitor the presence of at least signal in digital output signal 136 and to produce a digital feedback signal 138 based thereupon, for example, in one or more manners such as will be described further herein.

As further illustrated in FIG. 1, digital feedback circuitry 114 may be further optionally configured to receive analog input signal 130 via signal path 142 and/or to receive modified analog input signal 132 via signal path 144. As will be described further herein, signal path 142 allows a signal (e.g., interferer and/or desired signal) to be captured by digital feedback circuitry 114 upstream of combination of analog input signal 130 with analog cancellation signal 140, so that the signal may be captured at its native strength independent of any cancellation effect caused by analog input signal 130. Signal path 144 allows a signal to be captured by digital feedback circuitry 114 downstream of combination of analog input signal 130 with analog cancellation signal 140, so that the signal is captured in a weakened state caused by combination of analog input signal 130 with analog cancellation signal 140. It will be understood that the presence of each of signal paths 142 and 144 is optional for any given implementation, i.e., both signal paths 142 and 144 may be present, only one of signal paths 142 or 144 may be present, or neither one of signal paths 142 or 144 may be present.

As will be described further herein, digital feedback circuitry 114 may be configured (e.g., using the components 118 and/or 120 described elsewhere herein) to produce a digital feedback signal 138 by approximating or duplicating one or more given/signals (e.g., interferer signal/s and/or desired signal/s) present in system analog input 130 that are selected for partial or complete cancellation. Digital feedback signal 138 may then be converted to an analog cancellation signal 140 that is combined with the system analog input signal 130 to produce modified analog input signal 132 that is then converted to system digital output signal 134. One or more components of digital feedback circuitry 114 may be configured in feedback manner to monitor at least one of modified analog input signal 132 (e.g. via signal path 144) and/or system digital output signal 134 (e.g. via signal path 136), and to adjust digital feedback signal 138 in such a way that minimizes the given signals (e.g., interferer signal/s and/or desired signal/s) present in system analog input 130 that are selected for partial or complete cancellation. In this manner, digital feedback circuitry may be configured to produce a digital feedback signal 138 that results in an analog cancellation signal 140 that converges toward a desired signal cancellation criteria (e.g., toward partial or complete cancellation of given signal/s selected for cancellation).

One illustrative example of the above-described converging cancellation solution may be implemented using an adaptive filter in digital feedback circuitry 114 to produce a digital feedback signal 138 by approximating or duplicating a given signal/s selected for cancellation in system analog input signal 130, so that a corresponding analog cancellation signal 140 is produced that partially or completely cancels the given selected signal/s to produce modified analog input signal 132. Modified analog input signal 132 may then be fed back to digital feedback circuitry 114 (e.g. via signal path 144), and the filter coefficients of the adaptive filter adjusted to so that digital feedback signal 138 results in an analog cancellation signal 140 that converges toward a value that minimizes the given signal/s selected for cancellation in system analog input signal 130.

As illustrated in the exemplary embodiment of FIG. 1, digital feedback circuitry 114 may include at least one signal cancellation component 118 that is configured to produce digital feedback signal 138, and at least one signal cancellation control component 120 that is configured to control signal cancellation component 118. In such an embodiment, signal cancellation component 118 may include any component/s suitable for producing a digital feedback signal 138, for example, in a manner as will be described further herein. Examples of such components include, but are not limited to adaptive digital filters, ADC devices, analog amplifiers/attenuators, analog filters, analog tuners, combinations thereof, etc.

Signal cancellation control component 120 may include any suitable component/s suitable for controlling signal cancellation component/s 118 to produce digital feedback signal 138, for example, in one or more manners as described further herein. Examples of such components include, but are not limited to, digital adaptation algorithms, interference-cancellation algorithms, signal detection and parameter estimation algorithms, neural networks, etc. for controlling one or more interference cancellation components within the digital feedback circuitry such as a cancellation ADC, adaptive digital filter, analog amplifier/attenuator, analog filter, analog tuner or combination thereof. Using such algorithms, signal cancellation control component 120 may be configured to implement constraints or other criteria on generation of digital feedback signal 138 to match measured or estimated characteristics (e.g., frequency, bandwidth, etc.) of interferer signal and/or desired signal. Example of such criteria include, but are not limited to, power minimization, frequency range, bandwidth minimization range, etc.

In one embodiment, an adaptation algorithm may be modified to fit the bandwidth of an interferer (e.g., narrowband, wideband, etc.) so that an appropriate digital feedback signal 138 may be generated that results in an analog cancellation signal 140 having desired cancellation characteristics. For example, cancellation depth usually varies in an inverse manner to cancellation bandwidth so that these and other characteristics of signal cancellation control component 120 may be varied, in real time and/or based on predetermined selection, in order to balance such characteristics as desired or required to meet the needs of a given application.

It will be understood that the illustrated configuration of digital feedback circuitry 114 with components 118 and 120 is exemplary only, and that digital feedback circuitry may be configured in any other manner suitable for controlling signal cancellation DAC component 116 in a manner such as described herein.

Figure 2:
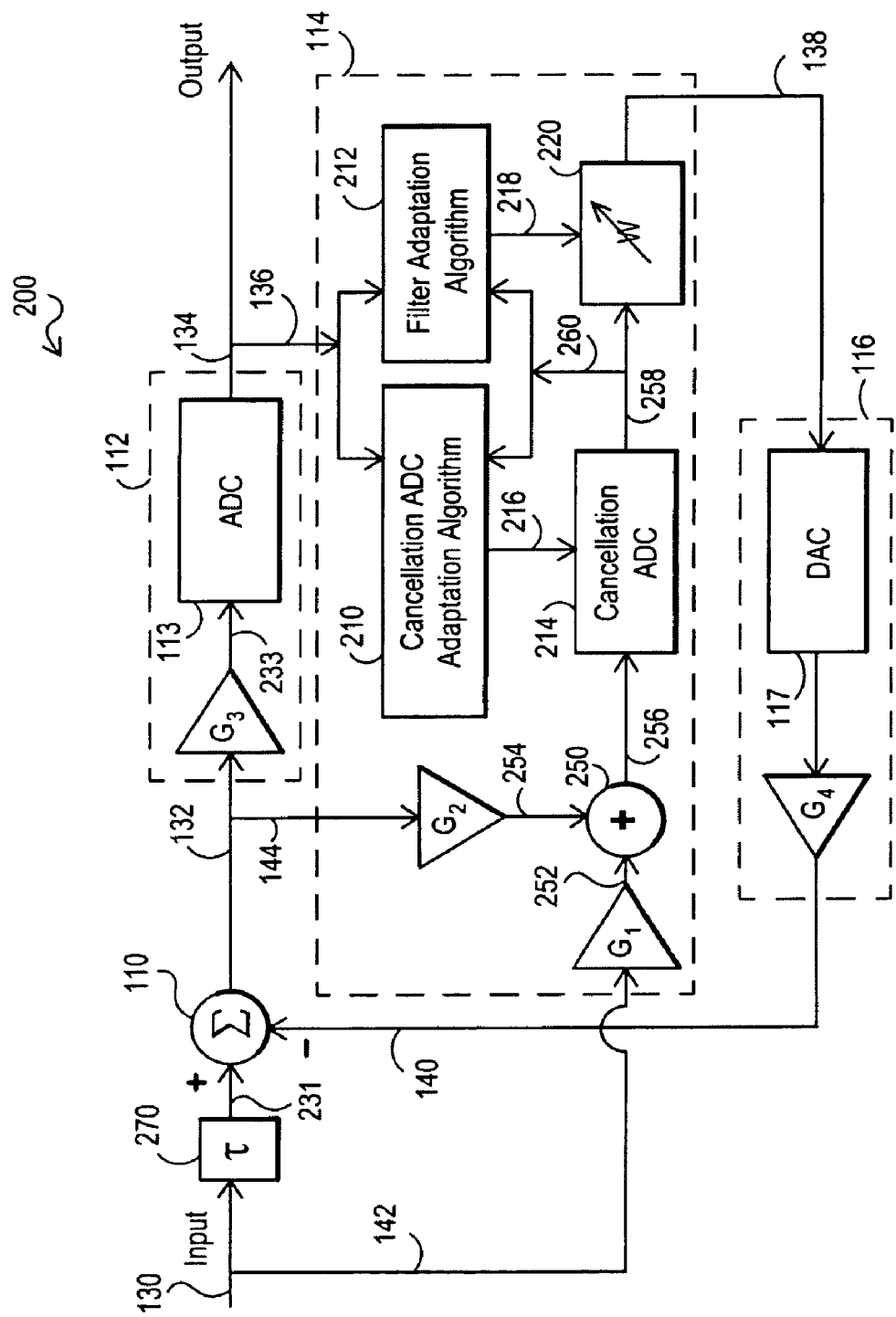
FIG. 2 illustrates an ADC system according to one embodiment of the disclosed systems and methods.

FIG. 2 illustrates one exemplary embodiment of an analog to digital conversion system 200 that may be, for example, implemented as an ADC interference cancellation system. As shown, system 200 is configured to receive an analog input signal 130 and to provide a digital output signal 134 in a manner as previously described. Illustrated components of system 200 include cancellation DAC component 116, summer 110, signal ADC component 112 and digital feedback circuitry 114. In the exemplary embodiment of FIG. 2, digital feedback circuitry 114 includes signal cancellation control components (provided in the form of cancellation ADC adaptation algorithm 210 and filter adaptation algorithm 212) that are respectively coupled to control signal cancellation components that are provided in the form of cancellation ADC component 214 and adaptive digital filter 220. Also illustrated in FIG. 2 are optional components (e.g., time delay 270 and variable gain/attenuators G1, G2, G3 and G4) that will be described further herein.

Analog input signal 130 may include, for example, a relatively weak desired signal (e.g., that would not saturate signal ADC component 112) in the presence of at least one relatively strong interferer signal (e.g., that would saturate signal ADC component 112). However, as will be described further herein, an ADC conversion system may be configured to process other strengths of desired signal/s relative to interferer signal/s in the practice of the disclosed systems and methods. As illustrated in FIG. 2, an unmodified analog input signal 130 may be supplied to cancellation ADC component 214 of digital feedback circuitry 114 by signal path 142, and/or a modified analog input signal 132 may be supplied to cancellation ADC component 214 of digital feedback circuitry 114 by signal path 144. As previously described, modified analog input signal 132 is produced by combination of analog input signal 130 with analog cancellation signal 140. In the illustrated embodiment, summer 250 is shown provided for combining signal paths 142 and 144 to form analog input 256 to cancellation ADC component 214.

It will be understood that an ADC system may be provided according to the disclosed systems and methods by using any suitable combination of hardware and/or software suitable for implementing the features described herein. For example, with respect to components of the exemplary system of FIG. 2, signal ADC component 112 may be any device (e.g., a single ADC device) or combination of devices (e.g., ADC device/s in combination with gain/attenuator device/s) suitable for analog to digital conversion. In the illustrated embodiment of FIG. 2, signal ADC component 112 is shown configured with an ADC device 113 in combination with an optional variable gain/attenuator device G3, the purpose of which will be described father herein, it being understood that in other embodiments signal ADC component 112 may include only an ADC device 113 without optional variable gain/attenuator device G3. Examples of suitable ADC devices for ADC device 113 include, but are not limited to, successive approximation ADCs, flash ADCs, sample and hold ADCs, sigma delta ADCs, composite ADCs, etc. It is also possible that ADC device 113 may be provided with noise shaping and/or tuning capability (e.g., a noise shaping tunable sigma-delta ADC device). In such a case, signal ADC component 112 may be controlled, for example, to optimize or hone in on a desired signal, to block an interferer signal, etc.

Similarly, signal cancellation DAC component 116 is shown configured with a DAC device 117 in combination with an optional variable gain/attenuator device G4, the purpose of which will also be described father herein, it being understood that in other embodiments signal DAC component 116 may include only a single device (e.g., single DAC device 117 without optional variable gain/attenuator device G4) or may include additional devices. Examples of suitable DAC devices for DAC device 117 include, but are not limited to, inverse sample and hold, interpolating, delta sigma, composite, etc.

Still referring to FIG. 2, cancellation ADC component 214 component may be provided to include a similar or different type of analog to digital conversion device/s as does signal ADC component 112. For example, cancellation ADC component 214 may be a traditional ADC device (e.g., successive approximation ADC device, flash ADC device, sample and hold ADC device, sigma-delta ADC device etc.), a noise shaping tunable sigma-delta ADC device, composite ADC device, including time-interleaved, etc. Similar to signal ADC component 112, cancellation ADC component 214 may be any device (e.g., a single ADC device) or combination of devices (e.g., ADC device/s in combination with gain/attenuator device/s) suitable for analog to digital conversion.

Adaptive digital filter 220 may be of any configuration suitable for providing a digital feedback signal 138 to signal cancellation DAC component 116 that produces an analog cancellation signal 140 that is combined with analog input signal 130 (or optionally delayed analog input signal 231) to yield a modified analog input signal 132 as described elsewhere herein, e.g., such as a modified signal 132 that does not saturate signal ADC component 112. Examples of suitable of adaptive digital filter configurations include, but are not limited to, finite impulse response, infinite impulse response, time invariant, time varying, transversal, lattice, frequency-domain, etc.

In the practice of the disclosed systems and methods, cancellation ADC adaptation algorithm 210 may be configured to tune and/or filter cancellation ADC component 214 to the frequency or estimated frequency of the interferer signal. In this regard, cancellation ADC adaptation algorithm 210 may be coupled via control path 216 to cancellation ADC component 214 that may be configured with noise shaping and/or tuning capability (e.g., noise shaping tunable sigma-delta ADC device). Although not shown, it is also possible that cancellation ADC adaptation algorithm 210 may be coupled via alternate or additional control path to a separate analog filtering and/or tuning component that is coupled in the input path of cancellation ADC component 214 to provide filtering and/or tuning capability (e.g., when cancellation ADC component 214 is an ADC device that lacks noise shaping and/or tuning capability and/or other filtering capability, or to provide additional filtering and/or tuning capability to the existing noise shaping/filtering and/or tuning capability of cancellation ADC component 214 as may be needed or desired).

Filter adaptation algorithm 212 may be coupled via control path 218 to adaptive digital filter 220 and may be configured to control output of adaptive digital filter 220 based at least in part on output of signal ADC component 112 sampled via signal path 136, e.g., to provide power minimization at the output 134 of signal ADC component 112, to avoid cancellation of a desired signal in analog input signal 130, etc. Signal cancellation control components such as cancellation ADC adaptation algorithm 210 and filter adaptation algorithm 212 may be implemented using any hardware and/or software configuration suitable for performing the tasks described elsewhere herein. For example, cancellation ADC adaptation algorithm 210 and filter adaptation algorithm 212 may be implemented using general purpose processors, specialized Digital Signal Processing (DSP) processors, Application Specific Integrated Circuits (ASICs), Field Programmable Gate Arrays (FPGAs), Programmable Logic Devices (PLDs), combinations thereof, etc.

Cancellation ADC adaptation algorithm 210 may be any algorithm suitable for controlling (e.g., via noise shaping/filtering or tuning) cancellation ADC component 214 based on one or more measured or estimated characteristics of an interferer signal. Examples of capabilities that may be implemented alone or in combination by cancellation ADC adaptation algorithm 210 include, but are not limited to, interferer frequency/bandwidth monitoring or estimation, generation of control signal 216 to optimize or otherwise influence ADC output signal 258 of cancellation ADC component 214 around an estimated or measured interferer frequency/bandwidth, etc.

Filter adaptation algorithm 212 may be any forcing function or algorithm suitable for controlling adaptive digital filter 220 to drive adaptation based on one or more measured or estimated characteristics of an interferer signal and/or desired signal. Examples of capabilities that may be implemented alone or in combination by filter adaptation algorithm 212 include, but are not limited to, un-constrained power minimization at the output of signal ADC 134 (e.g., power minimization corresponds roughly to interference cancellation in cases where the signal input 258 to adaptive digital filter 220 primarily includes only an interferer). In this regard, filter adaptation algorithm 212 may be configured to operate using any suitable constrained or unconstrained power minimization algorithms including, but not limited to, stochastic steepest descent algorithm, conjugate gradient algorithm, neural networks, Newton's method algorithm (e.g., direct full computations, seeking approximations, etc.), etc.

Other examples of capabilities that may be implemented by filter adaptation algorithm 212 include, but are not limited to, constraints to avoid cancellation of the desired signal (e.g., this may be desirable if the desired signal is strong and the dynamic ranges of the signal ADC component 112 and cancellation ADC component 214 overlap) such as descried, for example, in "Spatial Blocking Filter Derivative Constraints for the Generalized Sidelobe Canceller and MUSIC", Gerald L. Fudge and Darel A. Linebarger, IEEE Transactions on Signal Processing [see also Acoustics, Speech, and Signal Processing, IEEE Transactions on], Vol. 44, No. 1, January 1996, pages 51–61, which is incorporated herein by reference. Other example capabilities that may be implemented include, but are not limited to computationally and/or performance optimized cancellation algorithms such as described, for example, in the following references which are incorporated herein by reference: "A Low-Complexity Adaptive Echo Canceller for xDSL Applications", Shou-Sheu Lin and Wen-Rong Wu, Signal Processing, IEEE Transactions on [see also Acoustics, Speech, and Signal Processing, IEEE Transactions on], Volume 52, Issue 5, May 2004, Pages 1461–1465; "Architecture of a Single Chip Acoustic Echo and Noise Canceller Using Cross Spectral Estimation", Liem, M and Manck, O., 2003 IEEE International Conference on Acoustics, Speech, and Signal Processing, 2003 Proceedings (ICASSP '03), Apr. 6–10 2003, Vol. 2 pages 637–40; and "Adaptive Filter Theory", $2^{nd}$ Edition, Simon Haykin, © 1991, Prentice Hall, Englewood Cliffs, N.J.

In the exemplary configuration of FIG. 2, the presence of an interferer signal in the output 134 of signal ADC component 112 may be detected by sampling output signal 134 via signal path 136. In this exemplary embodiment, signal path 136 is shown provided to both cancellation ADC adaptation algorithm 210 and to filter adaptation algorithm 212 of FIG. 2. As illustrated in FIG. 2, performance of an ADC conversion system may be further optimized by sampling both the signal ADC output 134 and the cancellation ADC output 258 (e.g., via signal path 260) and using cancellation ADC adaptation algorithm to control cancellation ADC component 214 so as to be selective to the interfering signal (i.e., to only produce a signal that corresponds to the detected interfering signal) and/or to allow constraints to be placed on the ADC output 258 (i.e., to prevent cancellation ADC component 214 from producing a signal corresponding to the desired signal). In this regard, constraints on the ADC output 258 may be desirable, for example, so as to avoid cancellation of a desired signal in cases where the desired signal may be present in the cancellation ADC input path 256. Such a condition may occur, for example, when the dynamic range of the signal ADC component 112 overlaps with the dynamic range of cancellation ADC component 214, such as in a case of a relatively strong desired signal in the presence of a interferer signal. It is also possible that constrained filter adaptation algorithms may also or alternatively be implemented to constrain the adaptive filter 220 so that it removes the desired signal from the digital feedback signal 138.

As previously described, an ADC conversion system may be configured to operate for a given application based on the strength of a desired signal relative to an interferer signal that is present in a given analog input signal to the system. For example, in the case of a relatively strong interferer signal in the presence of a relatively weak desired signal, the dynamic range of cancellation ADC component 214 may be configured using any suitable methodology and/or circuit configuration so that ADC 214 operates above the dynamic range of signal ADC component 112 (ie., cancellation ADC component 214 is configured to be less sensitive than signal ADC component 112) so that cancellation ADC component 214 is not saturated by the relatively stronger interferer signal/s or is only partially saturated by the relatively stronger interferer signal/s present in analog input signal 130. This may be accomplished, for example, by designing ADC 214 to operate at a higher dynamic range than ADC 113 of ADC component 112, and/or by providing optional supplemental signal control. In another example, the dynamic range of cancellation ADC component 214 may be configured to overlap with the dynamic range of signal ADC component 112 to facilitate at least partial cancellation of an interferer signal that in its unmodified form does not saturate signal ADC component 112.

As an example of supplemental signal control that may be employed to vary the dynamic range of cancellation ADC component 214 relative to signal ADC component 112, FIG. 2 shows one exemplary embodiment in which supplemental signal control is provided using optional variable gain/attenuators G1, G2, and G3. Using such a configuration, an ADC conversion system 200 may be configured, for example, so that a relatively stronger interferer signal will only show up within the lower limit of cancellation ADC component 214 when it is strong enough to saturate (or nearly saturate) signal ADC component 112. FIG. 2 also illustrates optional variable gain/attenuator G4 that may be present as part of signal cancellation DAC component 116, for example, in order to control the amount of cancellation.

Although FIG. 2 shows an embodiment of an ADC conversion system 200 in which four optional variable gain/attenuators G1, G2, G3 and G4 are present, it will be understood that any one or more of optional variable gain/attenuators G1, G2, G3 and/or G4 may be selectively implemented in a given ADC conversion system in any combination that is desired or required to fit the needs of a given application. Furthermore, it will be understood that an ADC conversion system 200 may be implemented without the presence of any one of optional variable gain/attenuators G1, G2, G3 and/or G4 and that, when present, any one or more variable gain/attenuators may be configured with pre-set values or may be configured to be programmable in real time, e.g., to vary the dynamic ranges of signal ADC component 112 and cancellation ADC component 214 to fit the signal strengths of interferer signal/s and desired signal/s present in the analog input 130 in a given application.

For purposes of illustration, FIG. 2 illustrates optional variable gain/attenuator G3 as a part of signal ADC component 112 separate to ADC device 113, and optional variable gain/attenuator G4 as a part of signal cancellation DAC component 116 separate to DAC device 117. However, it will be understood that variable gain/attenuator device G3 may be provided as a separate component to ADC component 112 in the signal input path of ADC component 112, and/or that variable gain/attenuator device G4 may be provided as a separate component to DAC component 116 in the signal output path of DAC component 116. Furthermore, in addition or as an alternative to providing respective variable gain/attenuator devices G3 and G4, it is also possible that ADC device 113 may be provided as an ADC device that has integral variable gain/attenuator capability, and/or that DAC device 117 may be provided as a DAC device that has integral variable gain/attenuator capability.

Similarly, for purposes of illustration, FIG. 2 illustrates optional variable gain/attenuators G1 and G2 as a part of digital feedback circuitry 114 separate to cancellation ADC component 214. However, it will be understood that variable gain/attenuator devices G1 and/or G2 may be provided as separate components in the respective signal input paths 142 and/or 144 of digital feedback circuitry 114. It is also possible that a single variable gain/attenuator may be provided for both signal input paths 142 and 144, e.g., as a single variable gain/attenuator device within digital feedback circuitry 114 in the signal input path of cancellation ADC component 214. Furthermore, in addition or as an alternative to providing respective variable gain/attenuator devices G1 and/or G2, it is also possible that cancellation ADC component 214 may be provided as an ADC device that has integral variable gain/attenuator capability.

In the illustrated exemplary embodiment of FIG. 2, optional variable gain/attenuators G1 and G2 may also be used to control the relative weighting of unmodified analog input signal 130 (i.e., via signal path 142) with modified analog input signal 132 (i.e., via signal path 144) in analog input signal 256 that is provided to cancellation ADC component 214. For example, variable gain/attenuator G1 may be open in one embodiment so that only the modified analog input signal of signal path 144 is provided as analog input signal 256 to cancellation ADC component 214 through variable gain/attenuator G2. Such a configuration may be implemented, for example, to allow for simplified system design, to provide partial rather than full interference cancellation (e.g., so that the interference may be monitored in the output path 134), and/or to provide for avoidance of interference saturation of cancellation ADC component 214. FIG. 2 also shows the presence of optional time delay 270 that may be implemented to provide analog input signal 130 as a delayed signal 231 to summer 110. Implementation of optional time delay 270 will be described further herein. However, when present, the value of time delay 270 may be set to zero when only the modified analog input signal of signal path 144 is to be provided to cancellation ADC component 214.

For example, when an interferer is strong enough to exceed the lower detection limit of cancellation ADC component 214, it will be detected in both the input path of signal ADC component 112 and cancellation ADC component 214. However, the desired signal will not be detected in the input path of cancellation ADC component 214 when it does not exceed the lower detection limit of cancellation ADC component 214. Under such conditions, the frequency of the interferer may be detected or estimated (e.g., when signal ADC component 112 is saturated by the interferer) at output 134 of signal ADC component 112 via signal path 136 by cancellation ADC adaptation algorithm 210. Cancellation ADC component 214 may then be tuned and/or filtered to the frequency of the interferer. Digital output signal 258 from cancellation ADC component 214 may then be processed by adaptive digital filter 220 using power minimization or other cancellation techniques provided by filter adaptation algorithm 212. In this regard "power minimization" refers to minimization of the total output power of the output signal 134. Since the desired signal is not present in the path of cancellation ADC component 214, only the power contribution of the interferer signal is canceled by adaptive digital filter 220 and analog cancellation signal 140 produced by cancellation DAC component 116 is an out of phase representation of the interferer signal. Such an embodiment just described may be particularly useful for implementation in cases where an analog input signal 130 includes a very strong narrowband interferer signal.

In an embodiment implemented with the system of FIG. 2 in which only the modified analog input signal of signal path 144 is provided as analog input signal 256 to cancellation ADC component 214, the strength of the interferer signal in the input of cancellation ADC component 214 grows weaker as it is cancelled by analog cancellation signal 140. Due to the feedback nature of the cancellation, this decrease in strength of the interferer signal in turn leads to a correspondingly weaker cancellation signal 140, resulting in a more limited cancellation of the interferer by cancellation signal 140. Thus, such an embodiment may be characterized as providing a self-limiting interference cancellation.

In another embodiment that may be implemented using the system of FIG. 2, G2 may be open so that only the unmodified analog input signal of signal path 142 is provided as analog input signal 256 to cancellation ADC component 214 through variable gain/attenuator G2. In such an embodiment, a non-zero time delay $\tau$ may be provided by optional time delay 270 as shown in the analog signal input path before summer 110 to produce an analog input signal 231 that is time delayed relative to the analog input-signal of signal path 142, and so that cancellation ADC component 214 sees the interferer signal present in analog input signal 256 before signal ADC 113 sees the interferer signal present in analog input signal 233. This time delay allows cancellation ADC component 214 to receive and cancel the interferer signal (i.e., using analog cancellation signal 140) before the interferer signal is received by signal ADC component 112. Such a configuration may be useful, for example, to allow transient weak signals to be detected more easily due to the presence of non-zero time delay $\tau$ provided by time delay 270. Such a configuration may also provide for complete or near complete interference cancellation in the digital output signal 134 because cancellation ADC component 214 captures a direct and accurate copy of the interferer signal present in unmodified analog input signal 130 (e.g., via signal path 142) rather than receiving a modified analog input signal 132 after cancellation (e.g., via signal path 144).

Implementation of an optional non-zero time delay $\tau$ in the analog signal input path before summer 110 may also be used to allow for latency in adaptive digital filter 220. This feature may be particularly desirable, for example, for the cancellation of non-periodic and wideband interferers present in analog input signal 130. Presence of optional variable gain/attenuator G1 may be used to provide attenuation where an interferer signal provided in signal path 142 has a strength that exceeds the dynamic range of cancellation ADC component 214, thus allowing the strong interferer to be accurately cancelled by adaptive digital filter 220. This feature may also be implemented to provide for increased flexibility in interference cancellation. Further flexibility may be provided by configuring system 200 with a programmable time delay 270 the value of which may be set to zero, e.g., when it is desired to use signal path 144 instead of signal path 142 to provide an input analog signal to cancellation ADC component 214.

Although FIG. 2 illustrates an ADC conversion system 200 that is configured with selectable signal paths 142 and 144 for providing analog input signal to cancellation ADC component 214, it will be understood that an ADC conversion system may be configured in other embodiments to have only one of signal paths 142 or 144. Furthermore, an ADC conversion system may be configured with additional, fewer and/or alternative signal paths and/or components as may be desired or required to fit the needs of a given application. In this regard, system configuration may be varied based on one or more characteristics such as cost constraints, expected interference environment present in an analog input signal (e.g., narrow-band versus wideband interferers, near periodic versus non-periodic interferers, single versus multiple interferers, stationary versus non-stationary interferers, etc.), available ADC technology (e.g., noise shaping ADC versus traditional ADC), interferer cancellation goals (e.g., partial versus complete cancellation of interferer). It will also be understood that a system may be configured with multiple alternative ADC interference cancellation capabilities (e.g., multiple alternative signal paths and/or components) so that it is re-configurable in real time and/or by one or more configuration choices that may be made during assembly.

Figure 3:
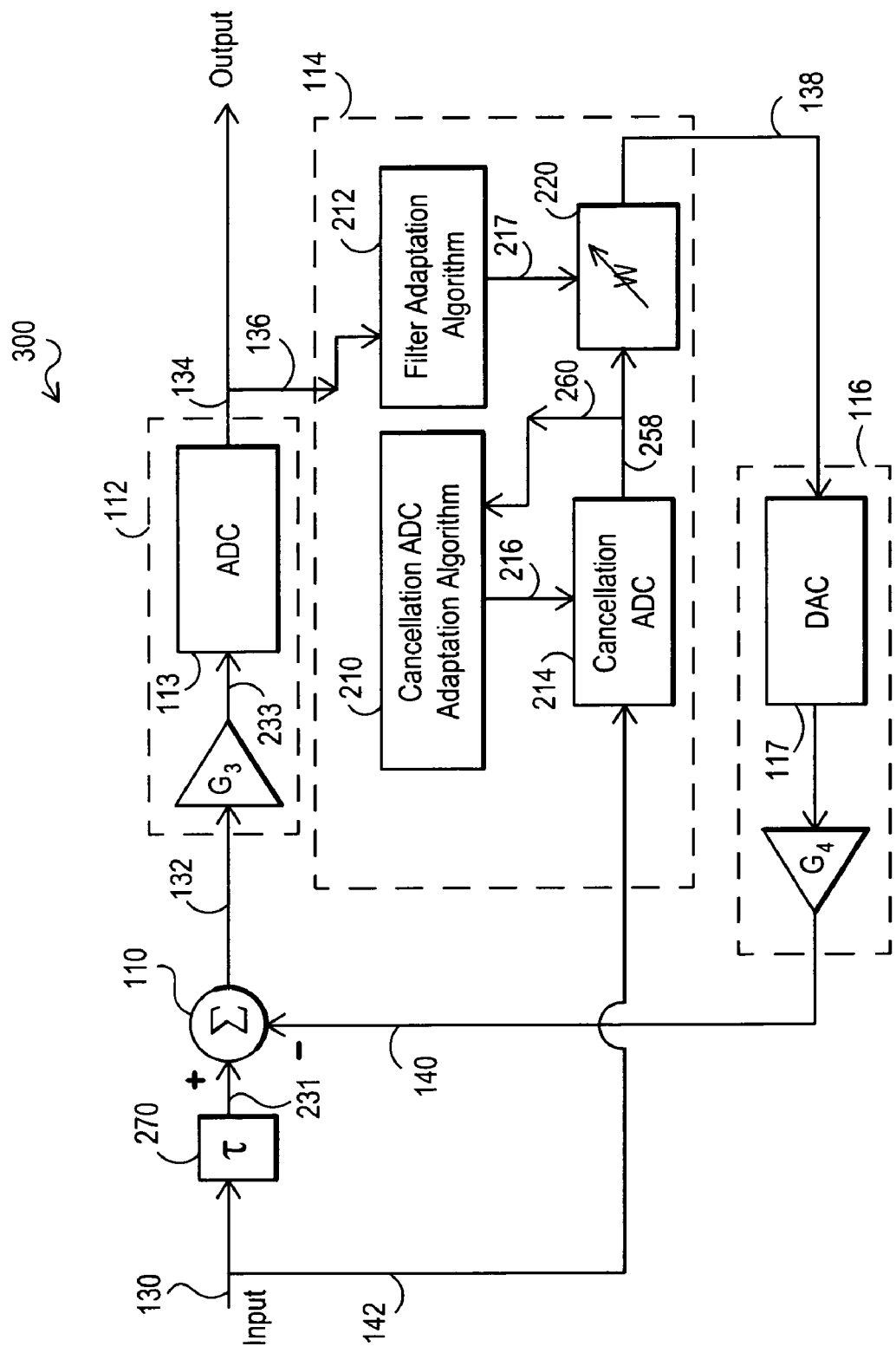
FIG. 3 illustrates an ADC system according to one embodiment of the disclosed systems and methods.

FIG. 3 illustrates another exemplary embodiment of an analog to digital conversion system 300 that may be, for example, implemented as an ADC interference cancellation system. In FIG. 3, ADC conversion system 300 is shown configured similar to the ADC conversion system 200 of FIG. 2, except that modified analog input signal path 144 (with its associated components and other signal paths) is not present, signal path 136 is not provided to cancellation ADC adaptation algorithm 210, and signal path 260 is not provided to filter adaptation algorithm 212. The configuration of FIG. 3 may be implemented, for example, to handle non-stationary interferers and wideband signals, but does not require as much hardware as ADC conversion system 200 of FIG. 2.

Figure 4:
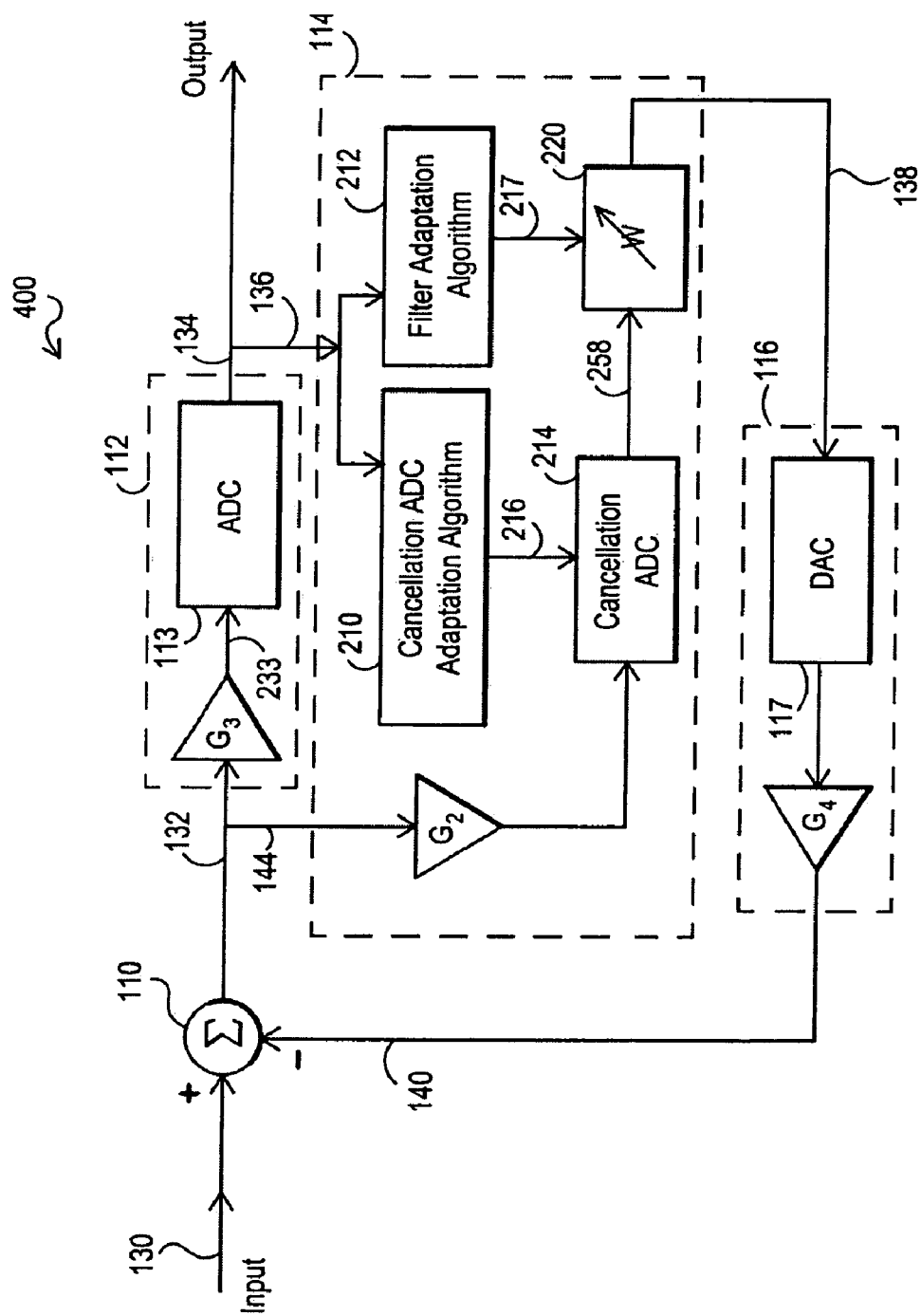
FIG. 4 illustrates an ADC system according to one embodiment of the disclosed systems and methods.

FIG. 4 illustrates another exemplary embodiment of an analog to digital conversion system 400 that may be implemented, for example, as an ADC interference cancellation system. In FIG. 4, ADC conversion system 400 is shown configured similar to the ADC conversion system 200 of FIG. 2, except that optional time delay 270 is absent, unmodified analog input signal direct path 142 (with its associated components and other signal paths) is not present, and signal path 260 is not provided to either cancellation ADC adaptation algorithm 210 or filter adaptation algorithm 212. In this embodiment, only the modified analog input signal 132 is provided to cancellation ADC component 214 via signal path 144. As so configured, cancellation ADC adaptation algorithm 210 and filter adaptation algorithm 212 only use signal ADC output 134 provided via signal path 136. Such a configuration of an ADC conversion system may be implemented to provide for interference monitoring in the signal ADC output 134. Because the delay path of time delay 270 is not present, the architecture of FIG. 4 is most applicable to cancellation of periodic interferers or interferers with high auto-correlation at time lags corresponding to the filter path latency.

Because system 400 of FIG. 4 does not include a time delay, the configuration of system 400 may be implemented more simply and in a less costly manner than system 300 of FIG. 3 or system 200 of FIG. 2, i.e., when these system configurations are implemented with optional time delay 270. Furthermore, because the configuration of system 400 may be implemented to achieve only partial signal cancellation, it may be desirable to implement this configuration to partially cancel a strong desired signal present in system analog input 130 that in unmodified form causes saturation of signal ADC 112 (e.g., strong desired signal in the absence of any interfering signal/s).

Figure 5:
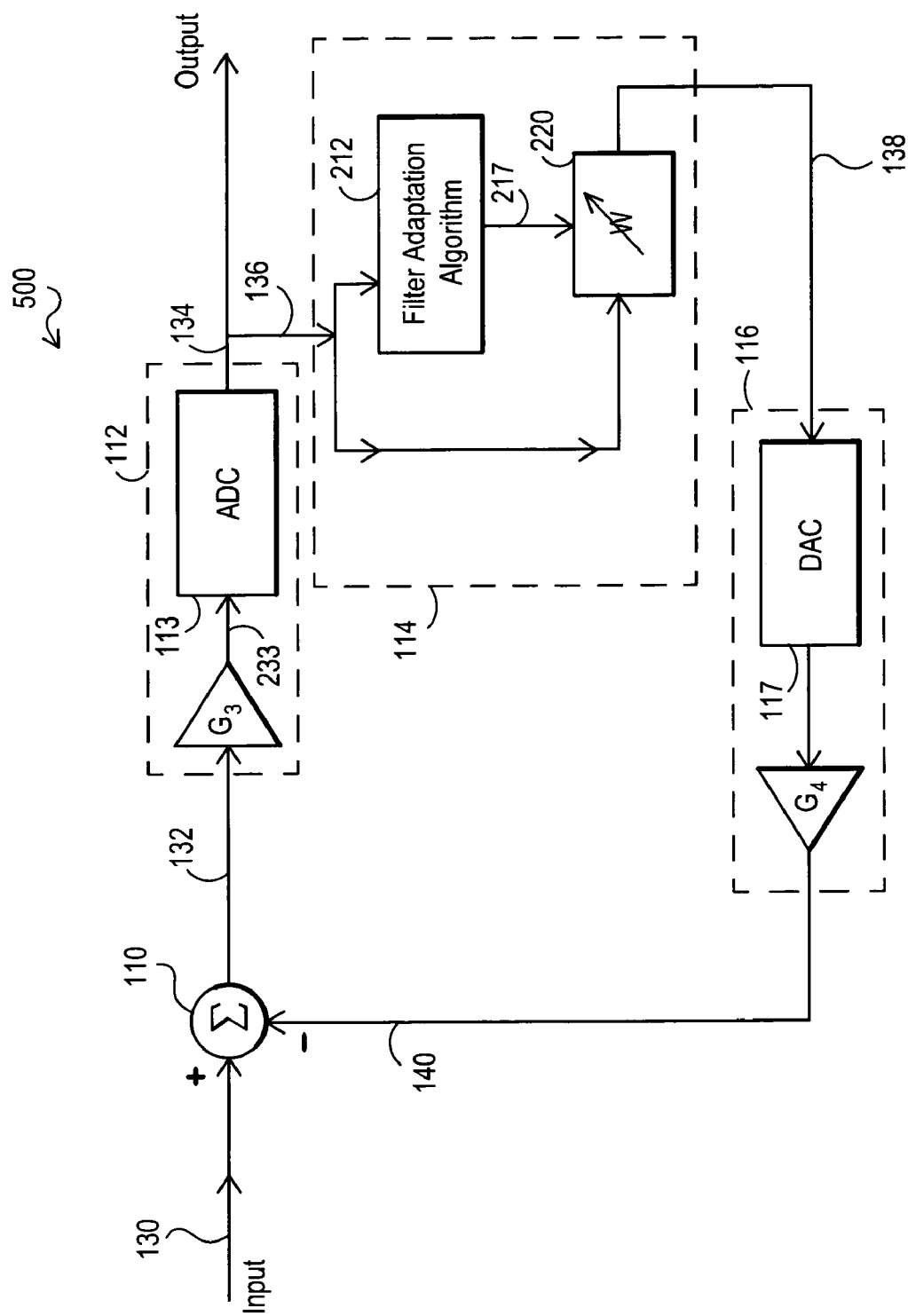
FIG. 5 illustrates an ADC system according to one embodiment of the disclosed systems and methods.

FIG. 5 illustrates another exemplary embodiment of an analog to digital conversion system 500 that may be implemented, for example, as an ADC interference cancellation system. In FIG. 5, ADC conversion system 500 is shown configured with digital feedback circuitry 114 that only includes filter adaptation algorithm 212 and adaptive digital filter 220 (i.e., no cancellation ADC is provided). Such a configuration generally requires less power consumption and less hardware than the configurations of FIGS. 2 to 4.

As shown in FIG. 5, signal ADC output 134 is provided to adaptive digital filter 220 via signal path 136 to drive digital feedback signal 138 that is provided to cancellation DAC component 116. In such an embodiment, filter adaptation algorithm 212 may be configured to provide unconstrained power minimization with a lower limit on total power minimization so that lower strength desired signals are not cancelled by resulting analog cancellation signal 140 generated by cancellation DAC component 116, e.g., so that strong narrowband interferers detected in signal ADC output 134 via signal path 136 may be substantially cancelled with substantially no cancellation of a weaker desired signal that is present with the stronger interferer. Although not illustrated in FIG. 5, it will be understood that filter adaptation algorithm 212 of system 500 may be configured to control adaptive filter 220 to produce a digital feedback signal 138 that results in an analog cancellation signal 140 that selectively cancels an interferer signal preferentially to a desired signal by providing frequency and/or bandwidth constraints to adaptive digital filter 220 based on signal ADC output 134, i.e., in addition to, or as an alternative to, lower limits on total power minimization.

It will be understood that although no cancellation ADC is shown provided in the embodiment of FIG. 5, that it is possible in another embodiment to provide a cancellation ADC component 214 that is configured to be selectably enabled (i.e., may be turned on or off) either in real time or by pre-selection. In such an alternative embodiment, a system configuration similar to that illustrated in FIG. 5 may be realized (e.g., using a system configuration such as illustrated and described for the embodiments of FIGS. 2–4) by turning off or deactivating the cancellation ADC component 214, and leaving filter adaptation component 212 and adaptive filter 220 components active so digital feedback signal 138 is based only on signal ADC output 134 received via signal path 136.

Figure 6:
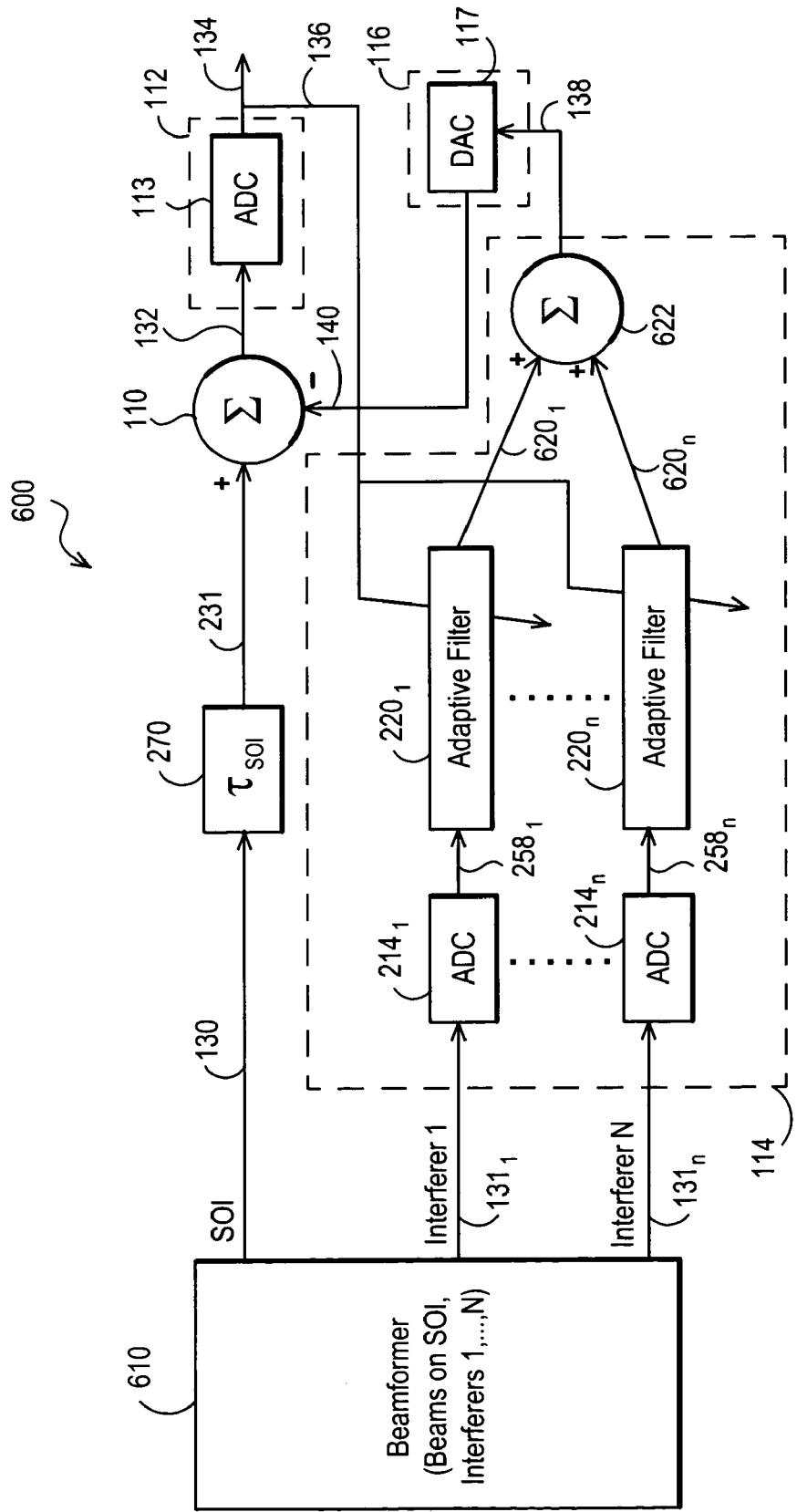
FIG. 6 illustrates an ADC system according to one embodiment of the disclosed systems and methods.

A block diagram for an exemplary embodiment of ADC system 600 that may be implemented as a spatial type of multi-channel high dynamic range interference canceller (HDRIC) system is shown in FIG. 6 for the case of N interferers. FIG. 6 shows ADC system 600 configured for a signal environment that includes a signal of interest (SOI) and a number N of multiple interferer signals that may be, for example, jamming or jammer signals and/or other types of undesirable signals. In one embodiment, the SOI may be a relatively weak powered signal in the signal environment as compared to relatively stronger powered N interferer signals in the signal environment, although it will be understood that in other embodiments the signal strength of SOI may be relative stronger and/or weaker in the signal environment as compared to any given one or more of the N interferer signals. In the exemplary embodiment of FIG. 6, analog input signal 130 may include the SOI corrupted by the N interferer signals with the SOI as the strongest signal component or the signal having the greatest signal strength weight. Each of analog input signals 131$a$ to 131$n$ may include a respective one of interferer signals 1 to N as the strongest signal component (i.e., interferer signal 1 as strongest signal component of analog input signal 131$_1$, interferer signal 2 as strongest signal component of analog input signal 131$_2$, interferer signal N as strongest signal component of analog input signal 131$_n$, etc.).

Analog input signal 130 may include the SOI as received on the N+1 channel and is corrupted by N interferer signals. The N+1 signal may also be realized as a beamformed signal. Input signals for system 600 of FIG. 6 may originate from an antenna beamformer 610 (e.g., Rotman Lens). In this regard, beamformer 610 may be configured to have a separate antenna beam pointing in the direction of each given RF signal (e.g., the SOI and interferer signals 1 to N) in a manner to produce a respective analog input signal in which the given RF signal is the strongest signal in that respective analog input signal.

Figure 7:
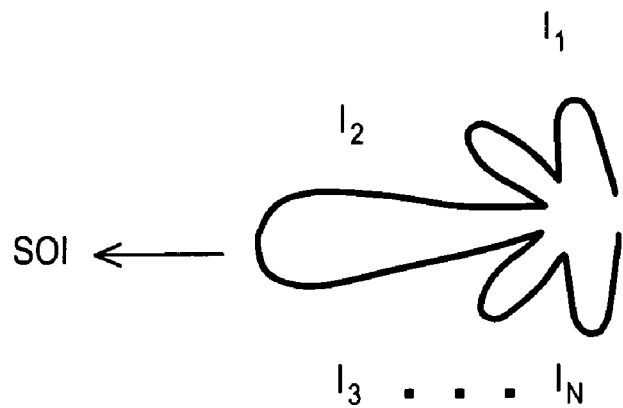
FIG. 7 illustrates a signal strength diagram according to one embodiment of the disclosed systems and methods.
Figure 8:
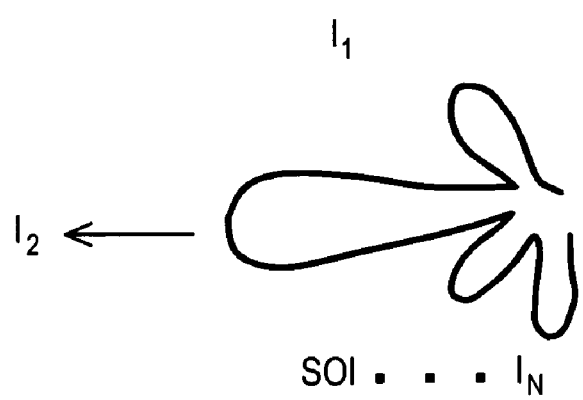
FIG. 8 illustrates a signal strength diagram according to one embodiment of the disclosed systems and methods.

For example, FIG. 7 shows a signal strength diagram representing analog input signal 130 provided by one antenna beam pointing in the direction of the desired signal (SOI) as shown by the direction of the arrow. The relative size of the signal lobes in FIG. 7 represent signal strength weight in analog input signal 130 for each signal received by the antenna beam of FIG. 7, i.e., SOI and interfering signals $I_1$ through $I_N$. As shown in FIG. 7, the SOI has the greatest signal strength weight in analog input signal 130. In the same manner, analog input signals 131$_1$ to 131$_n$ may originate from N other beams that each point in a direction of a given interferer signal. For example, FIG. 8 illustrates a signal strength diagram representing analog input signal 131$_2$ provided by an antenna beam pointing in the direction of a interferer signal 12. As shown in FIG. 8, interferer signal $I_2$ has the greatest signal strength weight in analog input signal 131$_2$.

Referring again to the spatial configuration embodiment of FIG. 6, ADC conversion system 600 is shown configured with digital feedback circuitry 114 that includes N signal paths corresponding to respective analog input signals 131$_1$ to 131$_n$. Each signal path of digital feedback circuitry 114 is coupled to a respective analog input signal 131, and includes a respective cancellation ADC component 214 coupled to a respective adaptive digital filter 220. For example, FIG. 6 shows a first digital feedback circuitry signal path that includes cancellation ADC component 214$_1$ and adaptive digital filter 220$_1$, and that is coupled to analog input signal 131$_1$. In this regard, cancellation ADC component 214$_2$ is configured to receive and convert analog input signal 131$_1$ to ADC output signal 258$_1$, cancellation ADC component 214$_2$ is configured to receive and convert analog input signal 131$_2$ to ADC output signal 258$_2$, etc.

Thus, in the spatial configuration embodiment of FIG. 6, there is shown provided N cancellation ADC components 214 that each have an analog input signal 131 that is composed mainly of a given interferer signal. These analog input signals are realized as the output of different positions on beamformer 610. Each of analog input signals 131 containing a respective N interferer signal is converted by a respective N cancellation ADC component 214 to a digital output signal 258 that is filtered with an adaptive filter 220 to provide a respective filtered digital output signal 620, e.g., to minimize ADC output power prior to combination with other filtered digital output signals 620.

It will be understood that each of one or more of the N cancellation ADC components 214 and its respective adaptive filter 220 may be configured as a signal path of a respective separate digital feedback circuitry component, or alternatively may be configured as a separate signal path through a common digital feedback circuitry component that includes at least one other N cancellation ADC component 214 and its respective adaptive filter 220.

Still referring to FIG. 6, the filtered digital output signal 620 provided by the respective adaptive filter 220 of each digital feedback circuitry signal path may be combined with the digital output signals 620 provided by the other adaptive filters 220 of the other digital feedback circuitry signal paths. In this regard, FIG. 6 shows adaptive filters 220$_1$ to 220$_n$ coupled to provide respective digital output signals 620$_1$ to 620$_n$ to summer 622, which is configured to combine signals 620$_1$ to 620$_n$ to produce a combined digital output signal that is provided as digital feedback signal 138 to DAC device 117 of signal cancellation DAC component 116. Signal cancellation DAC component 117 is in turn configured to convert digital feedback signal 138 to analog cancellation signal 140 in a manner as described elsewhere herein.

In the exemplary embodiment of FIG. 6, the combination of digital output signals 620$_1$ to 620$_n$ results in a combined digital output signal that in turn yields an analog cancellation signal 140 that in this embodiment contains the sum of interferer signals contained in analog input signals 131$_1$ to 131$_n$. Analog cancellation signal 140 is combined with optionally delayed analog input signal 231 to produce a modified analog input signal 132 that in this embodiment contains the sum of interferer signals contained in analog input signals 131$_1$ to 131$_n$ subtracted from the SOI. Analog cancellation signal 140 is provided to ADC device 113 of signal ADC component 112 in a manner as previously described elsewhere herein with regard to the embodiment of FIGS. 1–5, i.e., analog cancellation signal 140 may include an analog signal that is an in-phase representation of the summed interferer signals within analog input signal 130 that is subtracted from delayed analog input signal 231 at summer 110, or analog cancellation signal 140 may alternatively include an analog signal that is provided from digital feedback circuitry 114 and signal cancellation DAC 116 as an out of phase representation of the summed interferer signals within analog input signal 130 that is added to delayed analog input signal 231 at summer 110. In either case, analog cancellation signal 140 may be combined with delayed analog input signal 231 at summer 110 in a manner that acts to at least partially cancel at least one interferer signal in delayed analog input signal 231.

Thus, in the spatial configuration embodiment of FIG. 6, the N summed interferer signals 131$_1$ to 131$_n$ are subtracted from the N+1 signal 130 and fed as a modified analog input signal 132 into ADC device 113 of signal ADC component 112. ADC device 113 in turn provides a resulting interference cancelled signal as digital output signal 134. As illustrated in FIG. 6, the interference cancelled signal of digital output signal 134 is fed back as digital output signal 136 into adaptive filters 220$_1$ to 220$_n$ which may be configured to have weights set to minimize the power in the interference cancelled signal. In this regard, various configurations of digital feedback circuitry, various configurations of input signals to digital feedback circuitry, and various configurations for producing output signals of digital feedback circuitry have been previously described and illustrated herein in relation to the embodiments of FIGS. 1–5, i.e., filter adaptation algorithms and/or cancellation ADC adaptation algorithm components may be coupled as signal cancellation control components for each digital feedback circuitry signal path of FIG. 6 to control each respective cancellation ADC component $214_1$ to $214_n$ and/or adaptive filter $220_1$ to $220_n$, for example, in any of the manners described and illustrated in relation to the embodiments of FIGS. 2 through 5.

Figure 9:
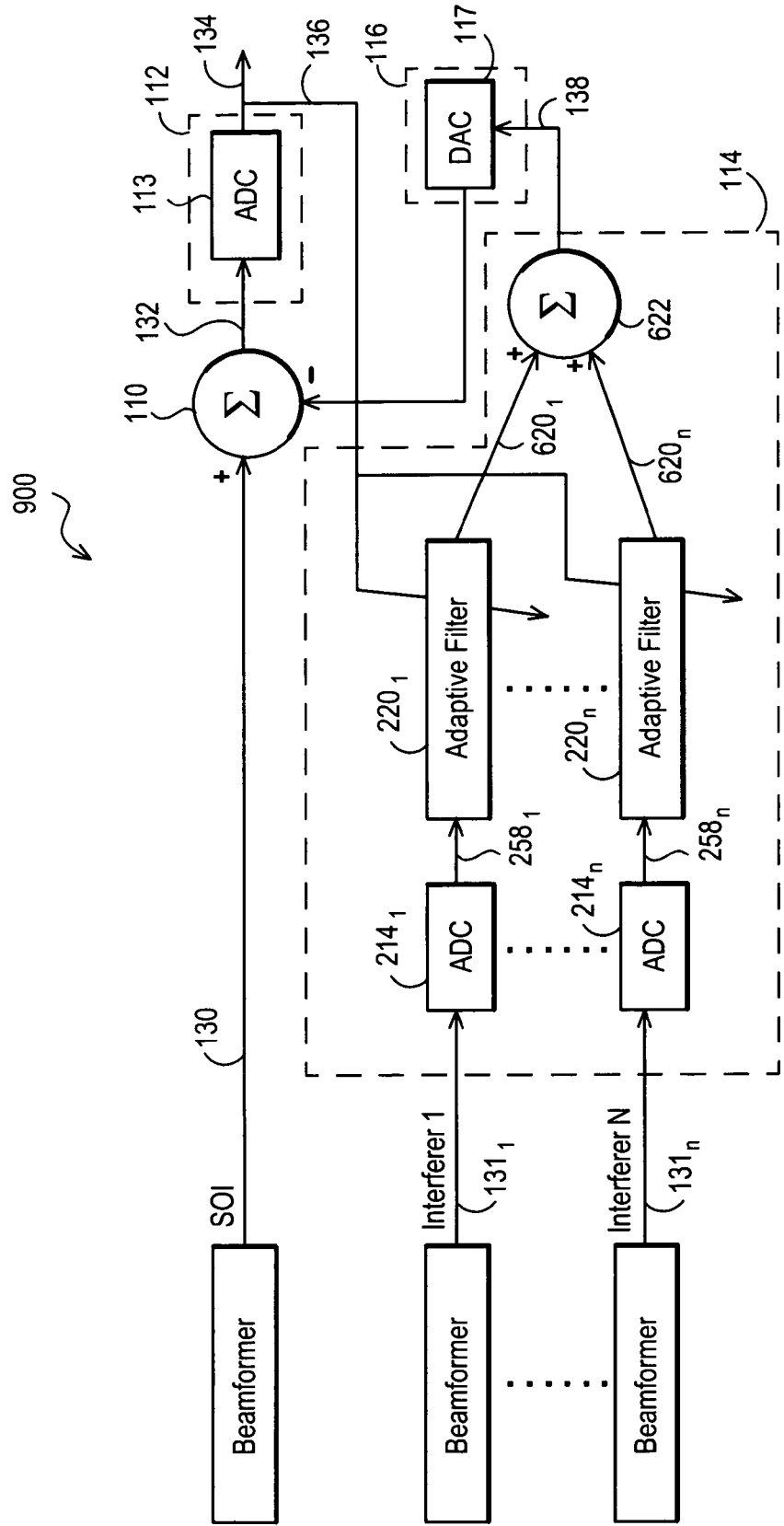
FIG. 9 illustrates an ADC system according to one embodiment of the disclosed systems and methods.

FIG. 6 also shows the presence of optional time delay 270 that may be implemented to provide analog input signal 130 as delayed signal 231 to summer 110. As previously described and illustrated in relation to the embodiments of FIGS. 2 and 3, a non-zero time delay τ may be provided by an optional time delay 270 in the analog signal input path before summer 110 to produce an analog input signal 231 that is time delayed relative to the analog input signals $131_1$ to $131_n$, so that cancellation ADC components $214_1$ to $214_n$ see the respective interferer signals present in analog input signals $131_1$ to $131_n$ before signal ADC component 112 sees the interferer signals present in modified analog input signal 132. This time delay allows cancellation ADC components $214_1$ to $214_n$ to receive and cancel the N interferer signals (i.e., using analog cancellation signal 140) before the N interferer signals are received by signal ADC component 112. Optional time delay 270 may also be present and implemented for other reasons described elsewhere herein, e.g., with respect the embodiments of FIGS. 2 and 3. The time delay component ($\tau_{SOI}$) 270 shown in FIG. 6 is optional and may be absent in other embodiments such as illustrated in FIG. 9. In the embodiment of FIG. 9, no time delay component 270 is present, and analog cancellation signal 140 is combined with analog input signal 130 to form modified analog input signal 132.

FIG. 6 illustrates an ADC system 600 configured for a signal environment that includes a signal of interest (SOI) and a number N of multiple interferer signals. In another embodiment, the disclosed systems and methods may be configured for analog to digital conversion of a signal using first and second analog signal inputs. This embodiment may be implemented by combining a first analog input signal with an analog cancellation signal to form a modified analog input signal and converting the modified analog input signal to a digital output signal. In this embodiment, a first digital feedback signal may be produced based at least in part on the digital output signal and on at least one analog signal that is based at least in part on the second analog input signal, and the first digital feedback signal may be converted to the analog cancellation signal. The first analog signal input may include an RF signal received from a first signal direction, and the second analog signal input may include an RF signal received from a second (and different) signal direction.

For example an analog to digital conversion system may be provided that has a system analog input for receiving a system analog input signal and a system digital output for providing a system digital output signal. The system of this embodiment may include: a signal analog to digital conversion (ADC) component having a first analog signal input coupled to the system analog input and a digital signal output coupled to the system digital output; a signal cancellation digital to analog conversion (DAC) component having a digital signal input and an analog signal output, the analog signal output being coupled between the system analog input and the analog input of the signal ADC component; and a first digital feedback circuitry signal path including a cancellation ADC component coupled to a second analog signal input, the first digital feedback circuitry signal path having a digital signal input coupled to the digital signal output of the signal ADC component, and the first digital feedback circuitry signal path further having a digital signal output. The signal cancellation DAC may be configured to receive the digital signal output of the first digital feedback circuitry signal path and to provide an analog cancellation signal based on the digital signal output of the first digital feedback circuitry signal path for combination with the system analog input signal to produce a modified analog input signal.

Figure 10:
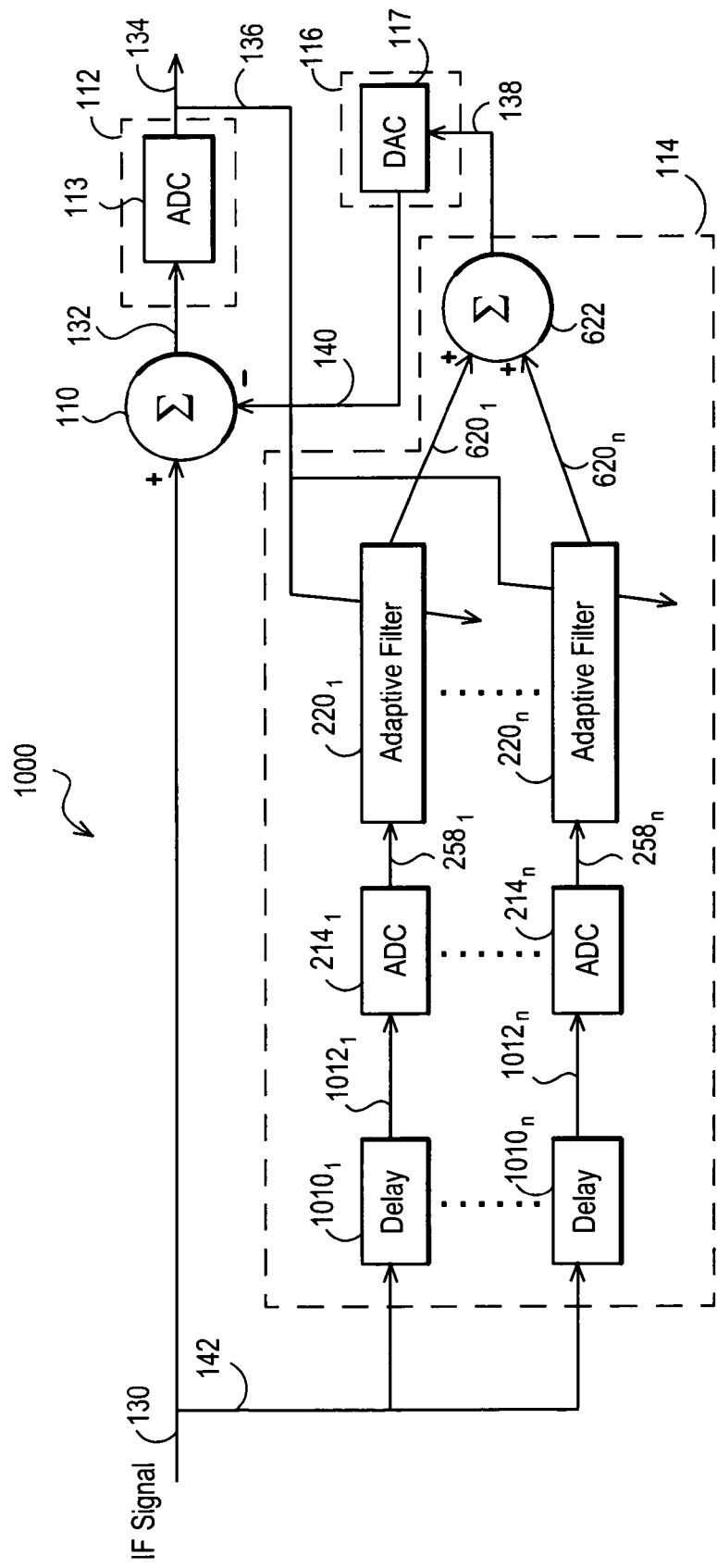
FIG. 10 illustrates an ADC system according to one embodiment of the disclosed systems and methods.

FIG. 10 illustrates another exemplary embodiment of an analog to digital conversion system 1000 that may be, for example, implemented as an ADC interference cancellation system in the form of a temporal multichannel HDRIC configured to subtract or cancel interference from periodic interferer signals. The configuration of system 1000 may be implemented, for example, to provide additional degrees of freedom when handling multiple interferer signals.

In the illustrated temporal configuration embodiment of FIG. 10, there is one analog input signal 130 (as opposed to N+1 signals). However, analog input signal 130 contains N periodic interferer signals, or one periodic interferer signal with up to N spectral components. As shown in FIG. 10, the single analog input signal 130 is fed via signal path 142 to separate signal paths (or channels) of digital feedback circuitry 114 that each include an optional delay component 1010, a cancellation ADC component 214, and an adaptive filter component 220. As described in relation to the embodiment of FIG. 6, the filtered digital output signal 620 provided by the respective adaptive filter 220 of each digital feedback circuitry signal path may be combined with the digital output signals 620 provided by the other adaptive filters 220 of the other digital feedback circuitry signal paths to produce a combined digital output signal that is provided as digital feedback signal 138 to DAC device 117 of signal cancellation DAC component 116. Signal cancellation DAC component 117 is in turn configured to convert digital feedback signal 138 to analog cancellation signal 140 in a manner as previously described.

Similar to the embodiment of FIGS. 6 and 9, it will be understood that with respect to FIG. 10 each of one or more of the N cancellation ADC components 214 and its respective adaptive filter 220 may be configured as a signal path of a respective separate digital feedback circuitry component, or alternatively may be configured as a separate signal path through a common digital feedback circuitry component that includes at least one other N cancellation ADC component 214 and its respective adaptive filter 220. In one embodiment, the resulting cancellation signal may be characterized as a multi-dimensional or vectorized cancellation stream.

The illustrated optional delay components 1010 of FIG. 10 may be provided to optimize the N periodic interferers for subtraction or cancellation from the analog signal input 130 prior to signal ADC component 112. In this regard, FIG. 10 shows adaptive filters $220_1$ to $220_n$ coupled to provide respective digital output signals $620_1$ to $620_n$ to summer 622, which is configured to combine signals $620_1$ to $620_n$ to produce a combined digital output signal that is provided as digital feedback signal 138 to DAC device 117 of signal cancellation DAC component 116. Signal cancellation DAC component 117 is in turn configured to convert digital feedback signal 138 to analog cancellation signal 140 in a manner as previously described. Analog cancellation signal 140 is subtracted from a delayed analog input signal 130 to form modified analog input signal 132 that is provided to signal ADC component 112 for conversion to system digital output signal 134.

As described in relation to the embodiment of FIG. 6, signal ADC component 112 of FIG. 10 provides an interference cancelled signal as digital output signal 134 which is fed back as digital output signal 136 into adaptive filters $220_1$ to $220_n$ of FIG. 10. These filters adapt as described before in relation to FIG. 6 in order to minimize the power in the interference cancelled signal. In one embodiment, one or more of the separate adaptive filters $220_1$ to $220_n$ may be optionally optimized to handle a class or classes of interferers, e.g., interferer bandwidth, interferer modulation, etc. It will be understood that the illustrated optional signal delay features (i.e., delay components $1010_1$ to $1010_n$) of FIG. 10 may be alternatively provided by the adaptive filters, e.g., no delay components 1010 separate to the adaptive filters 220 may be present where each respective adaptive filter 220 is configured to provide a signal delay for its respective interferer signal.

It will be understood that information described and illustrated in relation to FIGS. 1 through 5 (e.g., including various configurations of digital feedback circuitry, various configurations of input signals to digital feedback circuitry, and various configurations for producing output signals of digital feedback circuitry) relates to systems and method for analog to digital conversion that may be implemented in the practice of the disclosed systems and methods of the embodiment of FIGS. 6–10 to provide analog feedback to at least partially cancel one or more signals (e.g., one or more interfering signals present with one or more desired signals, one or more strong desired signals, etc.) at the analog input of an ADC, and that may be used in one embodiment to extend the effective dynamic range of an ADC. As previously described, one or more individual digital feedback circuitry signal paths of a multichannel ADC interference cancellation system may implemented using configurations of signal cancellation components 118 and/or signal cancellation control components 120 illustrated and described herein (e.g., including the configurations of any one or more of the embodiments of FIGS. 2 through 5). As another example, any one or more of variable gain/attenuators G1, G2, G3 and/or G4 described and illustrated in relation to FIGS. 2 through 5 may be provided and implemented in corresponding signal path/s and/or component/s of a multichannel ADC interference cancellation system such as described and illustrated in relation to the multichannel embodiments of FIGS. 6 through 10 (e.g., cancellation DAC components 116 of FIGS. 6, 9 and 10 may include variable gain/attenuator G4, signal ADC components 112 may include variable gain/attenuator G3, and/or multichannel digital feedback circuitry signal paths may be configured as signal paths 142 and/or 144 and may be provided with variable gain/attenuators G1 and/or G2).

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. An analog to digital conversion system having an analog input and a digital output, said system comprising:
   a signal analog to digital conversion (ADC) component having an analog signal input coupled to said analog input of said system and a digital signal output coupled to said digital output of said system;
   a signal cancellation digital to analog conversion (DAC) component having a digital signal input and an analog signal output, said analog signal output being coupled between said input of said analog to digital conversion system and said analog input of said signal ADC component;
   a first digital feedback circuitry signal path having a digital signal input coupled to said digital signal output of said signal ADC component, and having a digital signal output; and
   at least one additional digital feedback circuitry signal path having a digital signal input coupled to said digital signal output of said signal ADC component, and having a digital signal output provided for combination with said digital signal output of said first digital feedback circuitry signal path to produce a combined digital output signal;
   wherein said signal cancellation DAC is configured to receive said combined digital output signal and to provide an analog cancellation signal based on said combined digital output signal for combination with said system analog input signal to produce a modified analog input signal.

2. The system of claim 1, wherein said analog signal input of said system comprises a desired signal, a first interferer signal, and a second interferer signal; wherein said first digital feedback circuitry signal path has an analog signal input that comprises said first interferer signal; wherein said at least one additional digital feedback circuitry signal path has an analog signal input that comprises said second interferer signal; wherein each of said desired signal, said first interferer signal, and said second interferer signal is a signal received from a signal direction that is different than the signal direction of the other two of said desired signal, said first interferer signal, and said second interferer signal; and wherein said analog cancellation signal is effective to at least partially cancel each of said first and second interferer signals in said system analog input signal when combined with said system analog input signal so as to produce said modified analog input signal.

3. The system of claim 1, wherein said analog signal input of said system comprises a desired signal, a first interferer signal, and a second interferer signal; wherein each of said first interfere signal and said second interferer signals are periodic interferer signals; wherein each of said first digital feedback circuitry signal path and said at least one additional digital feedback circuitry signal path has an analog signal input coupled to said analog input of said system; and wherein said analog cancellation signal is effective to at least partially cancel each of said first and second interferer signals in said system analog input signal when combined with said system analog input signal so as to produce said modified analog input signal.

4. The system of claim 3, wherein each of said first digital feedback circuitry signal path and said at least one additional digital feedback circuitry signal path further comprises a signal delay feature.

5. An analog to digital conversion system having a system analog input for receiving a system analog input signal and a system digital output for providing a system digital output signal, said system comprising:

a signal analog to digital conversion (ADC) component having an analog signal input coupled to said system analog input and a digital signal output coupled to said system digital output;

a signal cancellation digital to analog conversion (DAC) component having a digital signal input and an analog signal output, said analog signal output being coupled between said system analog input and said analog input of said signal ADC component;

a first digital feedback circuitry signal path comprising a first cancellation ADC component coupled to said system analog input, said first digital feedback circuitry signal path having a digital signal input coupled to said digital signal output of said signal ADC component, and said first digital feedback circuitry signal path further having a digital signal output; and at least one additional digital feedback circuitry signal path comprising a cancellation ADC component coupled to said system analog input, said at least one additional digital feedback circuitry signal path having a digital signal input coupled to said digital signal output of said signal ADC component, and said at least one additional digital feedback circuitry signal path further having a digital signal output provided for combination with said digital signal output of said first digital feedback circuitry signal path to produce a combined digital output signal;

wherein said signal cancellation DAC is configured to receive said combined digital output signal and to provide an analog cancellation signal based on said combined digital output signal for combination with said system analog input signal to produce a modified analog input signal.

6. The system of claim 5, wherein said analog signal input of said system comprises a desired signal, a first interferer signal, and a second interferer signal; wherein said desired signal has the greatest signal strength weight of any signal in said first analog system input signal; wherein said first digital feedback circuitry signal path has an analog signal input that comprises said first interferer signal, said first interferer signal having the greatest signal strength weight of any signal in said analog system input of said first digital feedback circuitry; wherein said at least one additional digital feedback circuitry signal path has an analog signal input that comprises said second interferer signal, said second interferer signal having the greatest signal strength weight of any signal in said analog system input of said at least one additional digital feedback circuitry signal path; and wherein said analog cancellation signal is effective to at least partially cancel each of said first and second interferer signals in said system analog input signal when combined with said system analog input signal so as to produce said modified analog input signal.

7. The system of claim 6, wherein each of said desired signal, said first interferer signal, and said second interferer signal is an RF signal received from a signal direction that is different than the signal direction of the other two of said desired signal, said first interferer signal, and said second interferer signal.

8. The system of claim 7, wherein each one of said desired signal, said first interferer signal, and said second interferer signal originates from an antenna beam pointed in the direction of said respective desired signal, said first interferer signal, or said second interferer signal.

9. The system of claim 5, wherein said analog signal input of said system comprises a desired signal, a first interferer signal, and a second interferer signal; wherein each of said first interfere signal and said second interferer signals are periodic interferer signals; wherein each of said first digital feedback circuitry signal path and said at least one additional digital feedback circuitry signal path has an analog signal input coupled to said analog input of said system; and wherein said analog cancellation signal is effective to at least partially cancel each of said first and second interferer signals in said system analog input signal when combined with said system analog input signal so as to produce said modified analog input signal.

10. The system of claim 9, wherein each of said first digital feedback circuitry signal path and said at least one additional digital feedback circuitry signal path further comprises a signal delay feature.

11. The system of claim 5, wherein said analog to digital conversion system comprises an interference cancellation system; and wherein each of said first digital feedback circuitry signal path and said at least one additional digital feed back circuitry signal path each comprises at least one signal cancellation component configured to produce said respective digital signal output of said respective first digital feedback circuitry signal path or said at least one additional digital feed back circuitry signal path; and wherein each of said first digital feedback circuitry signal path and said at least one additional digital feed back circuitry signal path each comprises at least one signal cancellation control component coupled to said respective digital signal input of said respective of said respective first digital feedback circuitry signal path or said at least one additional digital feed back circuitry signal path that is configured to control said respective signal cancellation component of said respective first digital feedback circuitry signal path or said at least one additional digital feed back circuitry signal path to produce said respective digital signal output of said respective first digital feedback circuitry signal path or said at least one additional digital feed back circuitry signal path based at least in part on said digital signal output received from said signal ADC component.

12. The system of claim 11, wherein said signal cancellation component of each of said first digital feedback circuitry signal path and said at least one additional digital feed back circuitry signal path each comprises an adaptive filter; and wherein said signal cancellation control component of each of said first digital feedback circuitry signal path and said at least one additional digital feed back circuitry signal path each comprises a filter adaptation algorithm.

13. A method for analog to digital conversion of a signal, comprising:

combining an analog input signal with an analog cancellation signal to form a modified analog input signal;

converting said modified analog input signal to a digital output signal in a first analog to digital conversion (ADC) component;

producing a first digital feedback signal based at least in part on said digital output signal;

producing at least one additional digital feedback signal based at least in part on said digital output signal;

combining said first digital feedback signal with said at least one additional digital feedback signal to produce a combined digital feedback signal; and converting said combined digital feedback signal to said analog cancellation signal.

14. The method of claim 13, wherein said analog input signal comprises a desired signal, a first interferer signal, and a second interferer signal; wherein each of said desired signal, said first interferer signal, and said second interferer signal is a signal received from a signal direction that is different than the signal direction of the other two of said desired signal, said first interferer signal, and said second interferer signal; wherein said analog cancellation signal is effective to at least partially cancel each of said first and second interferer signals in said system analog input signal when combined with said system analog input signal to produce said modified analog input signal; and wherein said method further comprises:
producing said first digital feedback signal based at least in part on a second analog input signal that comprises said first interferer signal; and
producing said at least one additional digital feedback signal based at least in part on a third analog input signal that comprises said second interferer signal.

15. The method of claim 13, wherein said analog input signal comprises a desired signal, a first interferer signal, and a second interferer signal; wherein each of said first interfere signal and said second interferer signals are periodic interferer signals; wherein said analog cancellation signal is effective to at least partially cancel each of said first and second interferer signals in said system analog input signal when combined with said system analog input signal to produce said modified analog input signal; and wherein said method further comprises:
producing said first digital feedback signal based at least in part on said analog input signal; and
producing said at least one additional digital feedback signal based at least in part on said analog input signal.

16. The method of claim 15, further comprising:
producing said first digital feedback signal based at least in part on said analog input signal using a first digital feedback circuitry signal path that comprises a signal delay feature; and
producing said at least one additional digital feedback signal based at least in part on said analog input signal using at least one digital feedback circuitry signal path that comprises a signal delay feature.

17. A method for analog to digital conversion of a signal, comprising:
combining an analog input signal with an analog cancellation signal to form a modified analog input signal;
converting said modified analog input signal to a digital output signal;
producing at least two digital feedback signals, each of said at least two digital feedback signals being based at least in part on said digital output signal and on at least one analog signal;
combining said at least two digital feedback signals to produce a combined digital feedback signal; and
converting said combined digital feedback signal to said analog cancellation signal.

18. The method of claim 17, wherein said analog input signal comprises a desired signal, a first interferer signal, and a second interferer signal; wherein said desired signal has the greatest signal strength weight of any signal in said first analog system input signal; wherein said analog cancellation signal is effective to at least partially cancel each of said first and second interferer signals in said system analog input signal when combined with said system analog input signal to produce said modified analog input signal; and wherein said method further comprises:
producing said first digital feedback signal based at least in part on a second analog input signal that comprises said first interferer signal, said first interferer signal having the greatest signal strength weight of any signal in said second analog input signal; and
producing said at least one additional digital feedback signal based at least in part on a third analog input signal that comprises said second interferer signal, said second interferer signal having the greatest signal strength weight of any signal in said second analog input signal.

19. The method of claim 18, wherein each of said desired signal, said first interferer signal, and said second interferer signal is an RF signal received from a signal direction that is different than the signal direction of the other two of said desired signal, said first interferer signal, and said second interferer signal.

20. The method of claim 19, wherein each one of said desired signal, said first interferer signal, and said second interferer signal originates from an antenna beam pointed in the direction of said respective desired signal, said first interferer signal, or said second interferer signal.

21. The method of claim 17, wherein said analog input signal comprises a desired signal, a first interferer signal, and a second interferer signal; wherein each of said first interfere signal and said second interferer signals are periodic interferer signals; wherein said analog cancellation signal is effective to at least partially cancel each of said first and second interferer signals in said system analog input signal when combined with said system analog input signal to produce said modified analog input signal; and wherein said method further comprises:
producing said first digital feedback signal based at least in part on said analog input signal; and
producing said at least one additional digital feedback signal based at least in part on said analog input signal.

22. The method of claim 21, further comprising:
producing said first digital feedback signal based at least in part on said analog input signal using a first digital feedback circuitry signal path that comprises a signal delay feature; and
producing said at least one additional digital feedback signal based at least in part on said analog input signal using at least one digital feedback circuitry signal path that comprises a signal delay feature.

23. The method of claim 17, wherein said analog cancellation signal is effective to at least partially cancel each of said first and second interferer signals in said system analog input signal when combined with said system analog input signal to produce said modified analog input signal; and wherein said method further comprises producing each of said at least two digital feedback signals using a respective digital feedback circuitry signal path that comprises:
at least one signal cancellation component configured to produce a respective one of said at least two digital feedback signals, and
at least one signal cancellation control component coupled to said respective digital signal input of said respective digital feedback circuitry signal path that is configured to control said respective signal cancellation component of said respective digital feedback circuitry signal path to produce said respective digital feedback signal of said respective digital feedback circuitry signal path based at least in part on said digital output signal.

24. The method of claim 23, wherein said signal cancellation component of each of said first digital feedback circuitry signal path and said at least one additional digital feed back circuitry signal path each comprises an adaptive filter; and wherein said signal cancellation control component of each of said first digital feedback circuitry signal path and said at least one additional digital feed back circuitry signal path each comprises a filter adaptation algorithm.

25. An analog to digital conversion system having a system analog input for receiving a system analog input signal and a system digital output for providing a system digital output signal, said system comprising:
 a signal analog to digital conversion (ADC) component having a first analog signal input coupled to said system analog input and a digital signal output coupled to said system digital output;
 a signal cancellation digital to analog conversion (DAC) component having a digital signal input and an analog signal output, said analog signal output being coupled between said system analog input and said analog input of said signal ADC component; and
 a first digital feedback circuitry signal path comprising a cancellation ADC component coupled to a second analog signal input, said first digital feedback circuitry signal path having a digital signal input coupled to said digital signal output of said signal ADC component, and said first digital feedback circuitry signal path further having a digital signal output;
 wherein said signal cancellation DAC is configured to receive said digital signal output of said first digital feedback circuitry signal path and to provide an analog cancellation signal based on said digital signal output of said first digital feedback circuitry signal path for combination with said system analog input signal to produce a modified analog input signal.

26. The system of claim 25, wherein said first analog signal input comprises an RF signal received from a first signal direction; and wherein said second analog signal input comprises an RF signal received from a second signal direction; said first and second signal directions being different directions.

27. The system of claim 26, wherein said first signal direction comprises a direction of a signal of interest; and wherein said second signal direction comprises a direction of an interfering signal.

28. The system of claim 25, further comprising:
 at least one additional digital feedback circuitry signal path comprising a cancellation ADC component coupled to a third analog signal input, said at least one additional digital feedback circuitry signal path having a digital signal input coupled to said digital signal output of said signal ADC component, and said at least one additional digital feedback circuitry signal path further having a digital signal output provided for combination with said digital signal output of said first digital feedback circuitry signal path to produce a combined digital output signal; and
 wherein said signal cancellation DAC is configured to receive said combined digital output signal and to provide an analog cancellation signal based on said combined digital output signal for combination with said system analog input signal to produce said modified analog input signal.

29. The system of claim 28, wherein said first analog signal input comprises an RF signal received from a first signal direction; wherein said second analog signal input comprises an RF signal received from a second signal direction; and wherein said third analog signal input comprises an RF signal received from a third signal direction; said first, second and third signal directions being different directions.

30. The system of claim 29, wherein said first signal direction comprises a direction of a signal of interest; wherein said second signal direction comprises a direction of a first interfering signal; and wherein said third signal direction comprises a direction of a second interfering signal.

31. A method for analog to digital conversion of a signal, comprising:
 combining a first analog input signal with an analog cancellation signal to form a modified analog input signal;
 converting said modified analog input signal to a digital output signal;
 producing a first digital feedback signal based at least in part on said digital output signal and on at least one analog signal that is based at least in part on a second analog input signal; and
 converting said first digital feedback signal to said analog cancellation signal.

32. The method of claim 31, wherein said first analog signal input comprises an RF signal received from a first signal direction; and wherein said second analog signal input comprises an RF signal received from a second signal direction; said first and second signal directions being different directions.

33. The method of claim 32, wherein said first signal direction comprises a direction of a signal of interest; and wherein said second signal direction comprises a direction of an interfering signal.

34. A method for analog to digital conversion of a signal, comprising:
 combining a first analog input signal with an analog cancellation signal to form a modified analog input signal;
 converting said modified analog input signal to a digital output signal;
 producing a first digital feedback signal based at least in part on said digital output signal and on at least one analog signal that is based at least in part on a second analog input signal;
 producing a second digital feedback signal based at least in part on said digital output signal and on at least one analog signal that is based at least in part on a third analog input signal;
 combining said first and second digital feedback signals to produce a combined digital feedback signal; and
 converting said combined digital feedback signal to said analog cancellation signal.

35. The method of claim 34, wherein said first analog signal input comprises an RF signal received from a first signal direction; wherein said second analog signal input comprises an RF signal received from a second signal direction; and wherein said third analog signal input comprises an RF signal received from a third signal direction; said first, second and third signal directions being different directions.

36. The method of claim 35, wherein said first signal direction comprises a direction of a signal of interest; wherein said second signal direction comprises a direction of a first interfering signal; and wherein said third signal direction comprises a direction of a second interfering signal.

* * * * *

UNITED STATES PATENT AND TRADEMARK OFFICE
CERTIFICATE OF CORRECTION

PATENT NO. : 6,956,517 B1  Page 1 of 1
APPLICATION NO. : 10/916008
DATED : October 18, 2005
INVENTOR(S) : Baker et al.

It is certified that error appears in the above-identified patent and that said Letters Patent is hereby corrected as shown below:

In claim 3, column 24, line 54, delete "interfere," and insert --interferer--.

In claim 9, column 26, line 6, delete "interfere," and insert --interferer--.

In claim 15, column 27, line 25, delete "interfere," and insert --interferer--.

In claim 21, column 28, line 26, delete "interfere," and insert --interferer--.

Signed and Sealed this

Thirty-first Day of March, 2009

JOHN DOLL
*Acting Director of the United States Patent and Trademark Office*